(12) United States Patent
Min et al.

(10) Patent No.: US 10,332,780 B2
(45) Date of Patent: Jun. 25, 2019

(54) SEMICONDUCTOR DEVICE WITH FIELD EFFECT TRANSISTOR

(71) Applicant: SAMSUNG ELECTRONICS CO., LTD., Suwon-si, Gyeonggi-do (KR)

(72) Inventors: Sunki Min, Seoul (KR); Songe Kim, Seoul (KR); Koungmin Ryu, Hwaseong-si (KR); Je-Min Yoo, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/828,728

(22) Filed: Dec. 1, 2017

(65) Prior Publication Data

US 2018/0204762 A1   Jul. 19, 2018

(30) Foreign Application Priority Data

Jan. 17, 2017  (KR) .......................... 10-2017-0008216

(51) Int. Cl.
| *H01L 29/78* | (2006.01) |
| *H01L 21/762* | (2006.01) |
| *H01L 27/092* | (2006.01) |
| *H01L 29/423* | (2006.01) |
| *H01L 29/786* | (2006.01) |
| *H01L 21/8238* | (2006.01) |
| *H01L 29/06* | (2006.01) |

(52) U.S. Cl.
CPC .. *H01L 21/76229* (2013.01); *H01L 21/82385* (2013.01); *H01L 21/823821* (2013.01); *H01L 21/823878* (2013.01); *H01L 27/092* (2013.01); *H01L 27/0924* (2013.01); *H01L 29/0649* (2013.01); *H01L 29/0673* (2013.01); *H01L 29/42392* (2013.01); *H01L 29/7848* (2013.01); *H01L 29/78696* (2013.01)

(58) Field of Classification Search
CPC ....... H01L 21/76229; H01L 21/823821; H01L 29/0649; H01L 27/0924; H01L 21/823878; H01L 29/42392; H01L 29/0673; H01L 29/78696; H01L 29/7848
See application file for complete search history.

(56) References Cited

U.S. PATENT DOCUMENTS 8,609,510 B1   12/2013   Banna et al.
9,299,700 B2   3/2016    Park et al.
(Continued)

*Primary Examiner* — Steven H Loke
*Assistant Examiner* — Juanita B Rhodes
(74) *Attorney, Agent, or Firm* — Lee & Morse, P.C.

(57) ABSTRACT

A semiconductor device includes a substrate having a first active pattern and a second active pattern, the first active pattern including a first recess region dividing an upper portion thereof into a first portion and a second portion, the second active pattern including a second recess region dividing an upper portion thereof into a first portion and a second portion, a first insulating pattern covering an inner sidewall of the first recess region, and a second insulating pattern covering an inner sidewall of the second recess region. The first insulating pattern and the second insulating pattern include the same insulating material, and a volume fraction of the first insulating pattern with respect to a volume of the first recess region is smaller than a volume fraction of the second insulating pattern with respect to a volume of the second recess region.

20 Claims, 45 Drawing Sheets

(56) References Cited

U.S. PATENT DOCUMENTS

| | | |
|---|---|---|
| 9,412,616 B1 | 8/2016 | Xie et al. |
| 9,490,176 B2 | 11/2016 | Chang et al. |
| 9,590,032 B2 | 3/2017 | Lin et al. |
| 2013/0052795 A1* | 2/2013 | Watanabe ......... H01L 21/76229 |
| | | 438/427 |
| 2014/0001572 A1 | 1/2014 | Bohr et al. |
| 2016/0155741 A1 | 6/2016 | Yoo et al. |
| 2016/0247876 A1* | 8/2016 | Chung ................ H01L 29/0649 |
| 2017/0294356 A1* | 10/2017 | Yeh ................. H01L 21/823481 |

* cited by examiner

SEMICONDUCTOR DEVICE WITH FIELD EFFECT TRANSISTOR

CROSS-REFERENCE TO RELATED APPLICATION

Korean Patent Application No. 10-2017-0008216, filed on Jan. 17, 2017, in the Korean Intellectual Property Office, and entitled: "Semiconductor Device and Method for Manufacturing the Same," is incorporated by reference herein in its entirety.

BACKGROUND

1. Field

Embodiments relate to a semiconductor device and a method for manufacturing the same and, more particularly, to a semiconductor device including a field effect transistor and a method for manufacturing the same.

2. Description of the Related Art

Semiconductor devices are widely used in an electronic industry because of their small sizes, multi-functional characteristics, and/or low manufacture costs. Semiconductor devices may be categorized as any one of semiconductor memory devices storing logical data, semiconductor logic devices processing logic data, and hybrid semiconductor devices having both the function of the semiconductor memory devices and the function of the semiconductor logic devices. Semiconductor devices with excellent characteristics have been increasingly demanded with the development of the electronic industry, e.g., due to their high-reliability, high-speed, and/or multi-functionality. To satisfy these demands, semiconductor devices have been highly integrated and structures of semiconductor devices have become more and more complex.

SUMMARY

In an aspect, a semiconductor device may include a substrate having a first active pattern and a second active pattern, the first active pattern including a first recess region dividing an upper portion of the first active pattern into a first portion and a second portion, the second active pattern including a second recess region dividing an upper portion of the second active pattern into a first portion and a second portion, a first insulating pattern covering an inner sidewall of the first recess region, and a second insulating pattern covering an inner sidewall of the second recess region. The first insulating pattern and the second insulating pattern may include the same insulating material, and a volume fraction of the first insulating pattern with respect to a volume of the first recess region may be smaller than a volume fraction of the second insulating pattern with respect to a volume of the second recess region.

In an aspect, a semiconductor device may include a substrate including a first active pattern and a second active pattern, first gate electrodes intersecting the first active pattern, second gate electrodes intersecting the second active pattern, a first isolation pattern provided between the first gate electrodes to divide an upper portion of the first active pattern into a first portion and a second portion, and a second isolation pattern provided between the second gate electrodes to divide an upper portion of the second active pattern into a first portion and a second portion. A width of at least one of the first gate electrodes may be greater than a width of at least one of the second gate electrodes. A width of the first isolation pattern disposed between the first and second portions of the first active pattern may be greater than a width of the second isolation pattern disposed between the first and second portions of the second active pattern.

In an aspect, a method for manufacturing a semiconductor device may include forming a first sacrificial pattern and a second sacrificial pattern, which intersect a first active pattern and a second active pattern, respectively, on a substrate, selectively etching the second sacrificial pattern in such a way that a width of the second sacrificial pattern is smaller than a width of the first sacrificial pattern, forming gate spacers on sidewalls of the first and second sacrificial patterns, removing the first and second sacrificial patterns to form a first empty space and a second empty space, each of which is defined between the gate spacers, etching upper portions of the first and second active patterns exposed by the first and second empty spaces to form a first recess region and a second recess region, and forming a first isolation pattern and a second isolation pattern that fill the first recess region and the second recess region, respectively.

In an aspect, a semiconductor device may include a substrate having a first active pattern and a second active pattern, the first active pattern including a first recess region dividing an upper portion of the first active pattern into a first portion and a second portion, and the second active pattern including a second recess region dividing an upper portion of the second active pattern into a first portion and a second portion, a first insulating pattern covering an inner sidewall of the first recess region, and a second insulating pattern covering an inner sidewall of the second recess region, the first recess region being wider than the second recess region, wherein the first insulating pattern and the second insulating pattern include a same insulating material and have a same thickness in the first and second recess regions, respectively.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
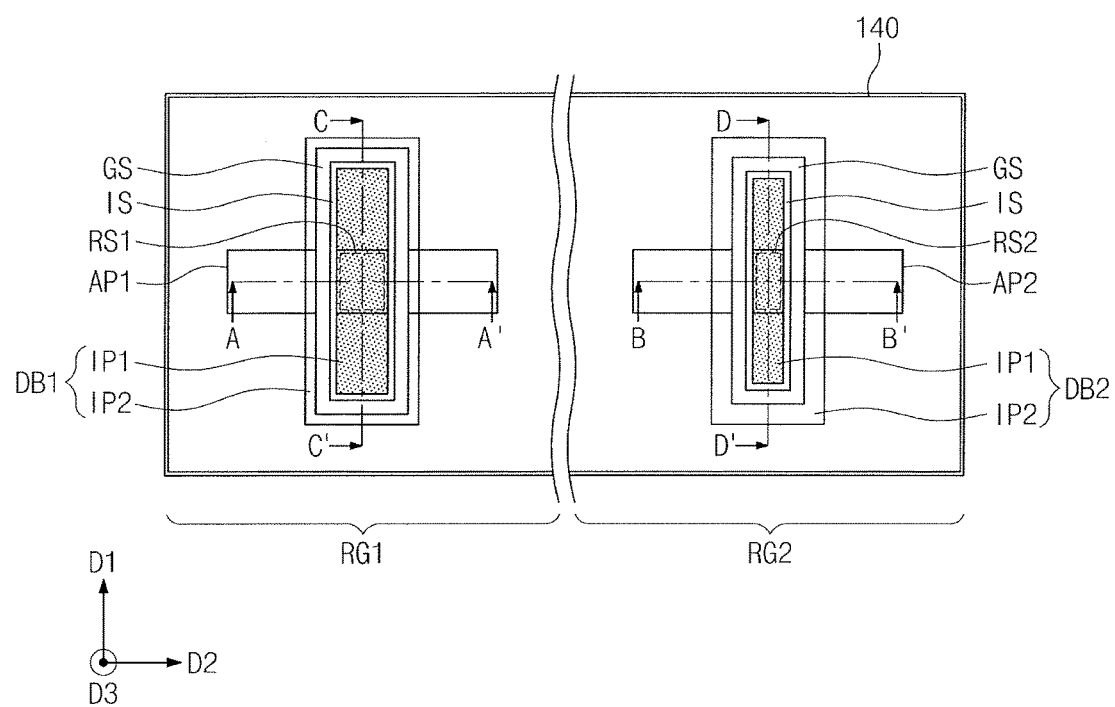
FIG. 1 illustrates a plan view of a semiconductor device according to some embodiments.
Figure 2A:
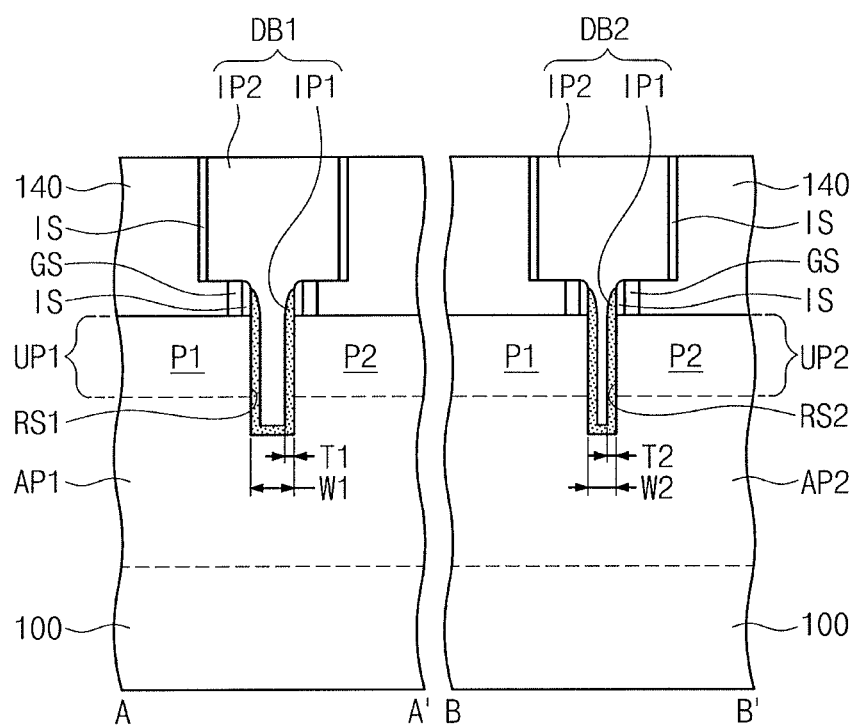
FIG. 2A illustrates a cross-sectional view along lines A-A' and B-B' of FIG. 1.
Figure 2B:
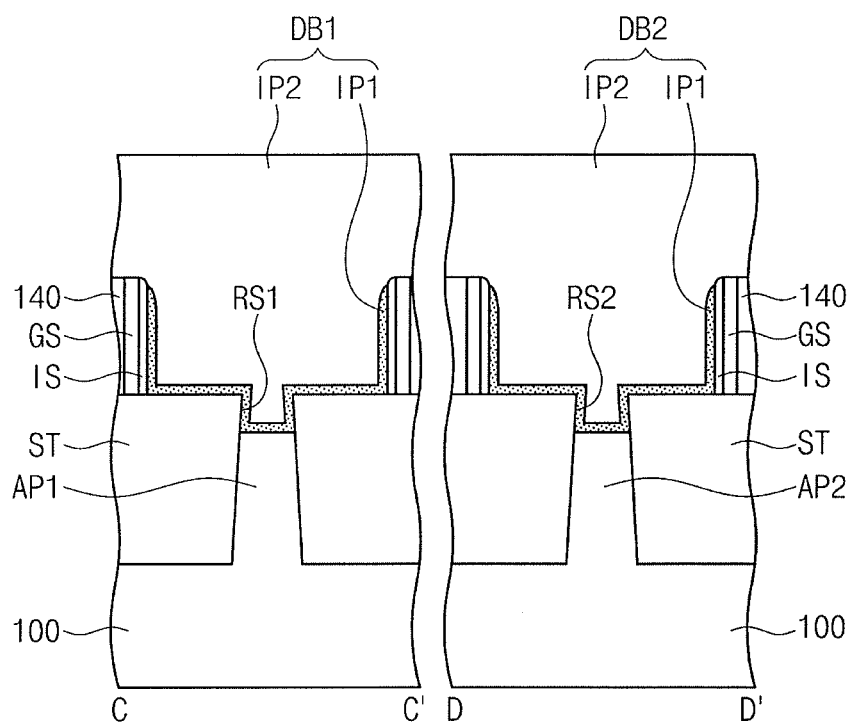
FIG. 2B illustrates a cross-sectional view along lines C-C' and D-D' of FIG. 1.
Figure 2B:
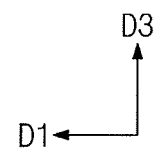
Figure 3:
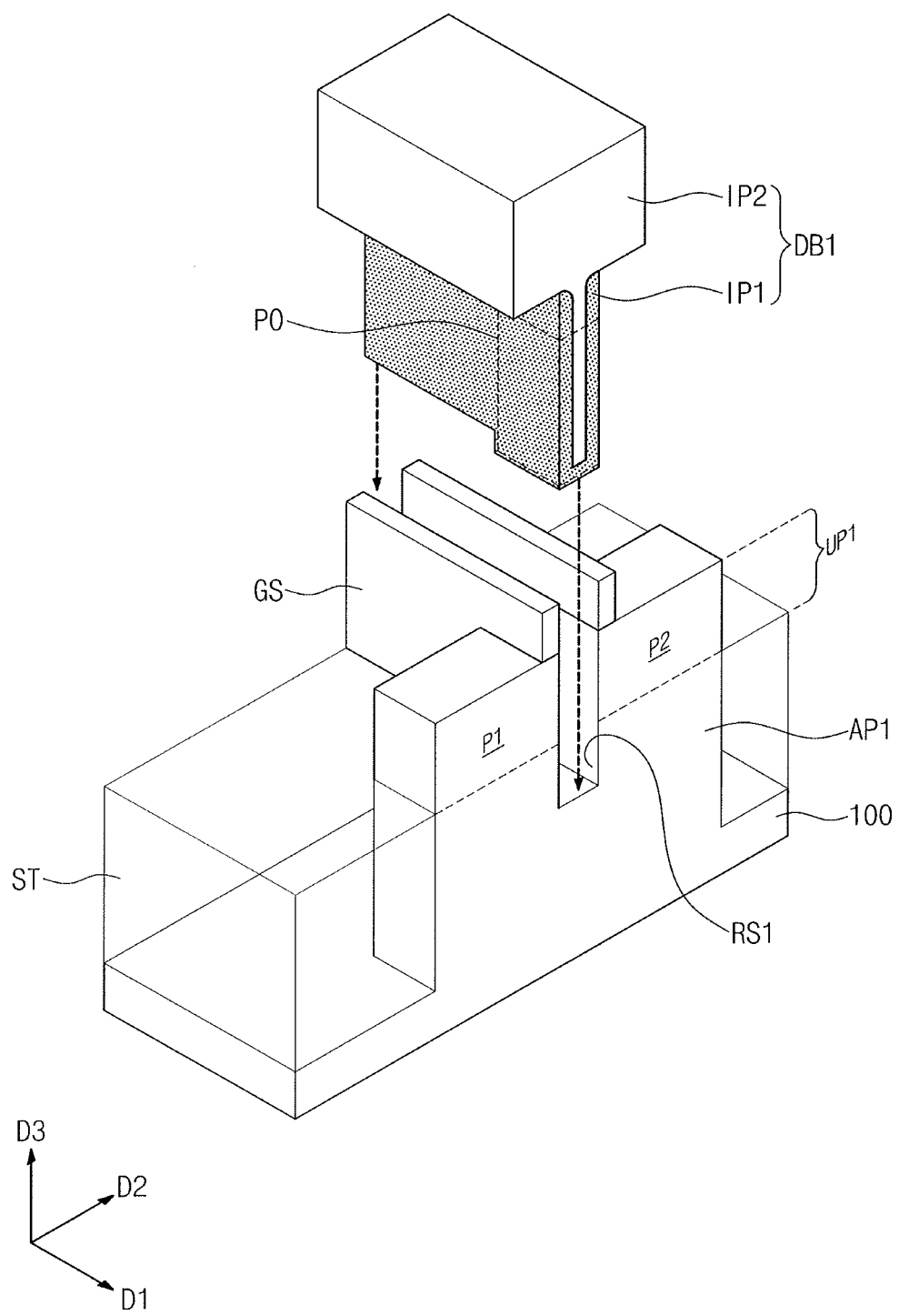
FIG. 3 illustrates a perspective view of a semiconductor device according to some embodiments.

FIG. 1 is a plan view illustrating a semiconductor device according to some embodiments. FIG. 2A is a cross-sectional view taken along lines A-A' and B-B' of FIG. 1, and FIG. 2B is a cross-sectional view taken along lines C-C' and D-D' of FIG. 1. FIG. 3 is a perspective view illustrating a semiconductor device according to some embodiments.

Referring to FIGS. 1, 2A, 2B, and 3, a substrate 100 having a first region RG1 and a second region RG2 may be provided. A device isolation layer ST may be provided in an upper portion of the substrate 100. The device isolation layer ST may define a first active pattern AP1 and a second active pattern AP2. The first active pattern AP1 may be disposed on the first region RG1, and the second active pattern AP2 may be disposed on the second region RG2. The substrate 100 may be a semiconductor substrate including, e.g., silicon, germanium, or silicon-germanium or may be a compound semiconductor substrate. In some embodiments, the substrate 100 may be a silicon substrate. The device isolation layer ST may include an insulating material, e.g., a silicon oxide layer.

The first and second active patterns AP1 and AP2 may extend in a second direction D2. The first and second active patterns AP1 and AP2 may be portions of the substrate 100, which protrude from a top surface of the substrate 100. The device isolation layer ST may directly cover lower portions of sidewalls of the first and second active patterns AP1 and AP2. In some embodiments, each of the first and second active patterns AP1 and AP2 may be an active region of a P-channel metal-oxide-semiconductor field effect transistor (PMOSFET) or an N-channel metal-oxide-semiconductor field effect transistor (NMOSFET). For example, the first active pattern AP1 may be the active region of the PMOSFET, and the second active pattern AP2 may be the active region of the NMOSFET. However, embodiments are not limited thereto.

A first upper portion UP1 of the first active pattern AP1 and a second upper portion UP2 of the second active pattern AP2 may be higher than a top surface of the device isolation layer ST. In other words, the first and second upper portions UP1 and UP2 of the first and second active patterns AP1 and AP2 may protrude vertically from the device isolation layer ST. The first and second upper portions UP1 and UP2 of the first and second active patterns AP1 and AP2 may have fin shapes protruding from, e.g., above, the device isolation layer ST.

The first active pattern AP1 may include a first recess region RS1 that divides the first upper portion UP1 into a first portion P1 and a second portion P2. The second active pattern AP2 may include a second recess region RS2 that divides the second upper portion UP2 into a first portion P1 and a second portion P2. Bottoms of the first and second recess regions RS1 and RS2 may be lower than the top surface of the device isolation layer ST. The first recess region RS1 may have a first width W1 in the second direction D2, and the second recess region RS2 may have a second width W2 in the second direction D2. The first width W1 may be greater than the second width W2. A width of the first recess region RS1 in a first direction D1 intersecting the second direction D2 may be substantially equal to a width of the second recess region RS2 in the first direction D1.

A gate spacer GS may extend in the first direction D1 to intersect each of the first and second active patterns AP1 and AP2. A pair of the gate spacers GS may be disposed on each of the first and second active patterns AP1 and AP2. In some embodiments, the pair of gate spacers GS may be connected to each other to constitute a closed loop shape when viewed in a plan view (see FIG. 1). The first recess region RS1 may be disposed between the pair of gate spacers GS on the first active pattern AP1 in a plan view, and the second recess region RS2 may be disposed between the pair of gate spacers GS on the second active pattern AP2 in a plan view. For example, the gate spacers GS may include at least one of $SiO_2$, SiCN, SiCON, or SiN. For example, each of the gate spacers GS may have a multi-layered structure formed of at least two of $SiO_2$, SiCN, SiCON, or SiN.

An interlayer insulating layer 140, i.e., a first interlayer insulating layer 140, may be provided on the substrate 100. The interlayer insulating layer 140 may cover the first and second active patterns AP1 and AP2 and the gate spacers GS. For example, the interlayer insulating layer 140 may include an insulating material, e.g., a silicon oxide layer.

A first isolation pattern DB1 may fill the first recess region RS1 of the first active pattern AP1, and a second isolation pattern DB2 may fill the second recess region RS2 of the second active pattern AP2. In other words, the first and second isolation patterns DB1 and DB2 may penetrate the first and second upper portions UP1 and UP2 of the first and second active patterns AP1 and AP2, respectively. The first and second isolation patterns DB1 and DB2 may extend in the first direction D1 to intersect the first and second active patterns AP1 and AP2, respectively. Top surfaces of the first and second isolation patterns DB1 and DB2 may be substantially coplanar with a top surface of the interlayer insulating layer 140.

Insulating spacers IS may be disposed between the interlayer insulating layer 140 and the isolation patterns DB1 and DB2 and between the gate spacers GS and the isolation patterns DB1 and DB2. Sidewalls of the insulating spacers IS between the gate spacers GS and the isolation patterns DB1 and DB2 may be aligned with inner sidewalls of the first and second recess regions RS1 and RS2. For example, the insulating spacers IS may include an insulating material, e.g., a silicon oxide layer.

Each of the first and second isolation patterns DB1 and DB2 may include a first insulating pattern IP1 and a second insulating pattern IP2. The first insulating pattern IP1 may be disposed in a lower portion of each of the first and second isolation patterns DB1 and DB2, and the second insulating pattern IP2 may be disposed on the first insulating pattern IP1. The first insulating pattern IP1 may cover the inner sidewall of each of the first and second recess regions RS1 and RS2. The first insulating pattern IP1 may also cover a sidewall of the insulating spacer IS disposed on a sidewall of the gate spacer GS. A thickness T1 of the first insulating pattern IP1 in the first recess region RS1 may be substantially equal to a thickness T2 of the first insulating pattern IP1 in the second recess region RS2.

The first insulating pattern IP1 may extend from the bottom of each of the first and second recess regions RS1 and RS2 onto the top surface of the device isolation layer ST. Bottom surfaces of the first insulating patterns IP1 in the first and second recess regions RS1 and RS2 may be lower than bottom surfaces of the first insulating patterns IP1 disposed on the top surface of the device isolation layer ST. The first insulating pattern IP1 may extend along the gate spacers GS in the first direction D1 between the pair of gate spacers GS.

The second insulating pattern IP2 may extend along with the first insulating pattern IP1 in the first direction D1. A lower portion of the second insulating pattern IP2 may fill a remaining space of each of the first and second recess regions RS1 and RS2. The remaining space refers to a residual space of each of the first and second recess regions RS1 and RS2 except the first insulating pattern IP1. An upper portion of the second insulating pattern IP2 may be disposed on the gate spacer GS. The upper portion of the second insulating pattern IP2 may cover a top surface of the gate spacer GS. A width of the upper portion of the second insulating pattern IP2 in the second direction D2 may be greater than a width of the lower portion of the second insulating pattern IP2 in the second direction D2. A top surface of the second insulating pattern IP2 may be substantially coplanar with the top surface of the interlayer insulating layer 140.

The first insulating pattern IP1 and the second insulating pattern IP2 may include different insulating materials from each other. For example, the first insulating pattern IP1 may include a silicon nitride layer or a silicon oxynitride layer, and the second insulating pattern IP2 may include a silicon oxide layer.

The first and second isolation patterns DB1 and DB2 may include diffusion barrier portions PO that fill the first and second recess regions RS1 and RS2, as illustrated in FIG. 3. The diffusion barrier portion PO may prevent carriers from moving between the first portion P1 and the second portion P2 of the first or second active pattern AP1 or AP2. A volume of the diffusion barrier portion PO of the first isolation pattern DB1 may be substantially equal to a volume of a space defined by the first recess region RS1, and a volume of the diffusion barrier portion PO of the second isolation pattern DB2 may be substantially equal to a volume of a space defined by the second recess region RS2.

A volume fraction of the first insulating pattern IP1 in the diffusion barrier portion PO of the first isolation pattern DB1 may be smaller than a volume fraction of the first insulating pattern IP1 in the diffusion barrier portion PO of the second isolation pattern DB2. In more detail, since the width W1 of the first recess region RS1 is greater than the width W2 of the second recess region RS2, the volume of the first recess region RS1 may be greater than the volume of the second recess region RS2. In addition, the thickness T1 of the first insulating pattern IP1 in the first recess region RS1 may be substantially equal to the thickness T2 of the first insulating pattern IP 1 in the second recess region RS2, and thus a volume of the first insulating pattern IP1 in the first recess region RS1 may be substantially equal or similar to a volume of the first insulating pattern IP1 in the second recess region RS2. As a result, the volume fraction of the first insulating pattern IP1 with respect to the volume of the first recess region RS1 may be smaller than the volume fraction of the first insulating pattern IP1 with respect to the volume of the second recess region RS2. The volume fraction of the first insulating pattern IP1 with respect to the volume of the first recess region RS1 is a ratio of the volume of the first insulating pattern IP1 in the diffusion barrier portion PO of the first isolation pattern DB1 to the volume of the first recess region RS1, and the volume fraction of the first insulating pattern IP1 with respect to the volume of the second recess region RS2 is a ratio of the volume of the first insulating pattern IP1 in the diffusion barrier portion PO of the second isolation pattern DB2 to the volume of the second recess region RS2.

According to some embodiments, the first isolation pattern DB1 having a relatively wide width may be provided on the first region RG1, and the second isolation pattern DB2 having a relatively narrow width may be provided on the second region RG2. In the event that electrical characteristics of a semiconductor component on the first region RG1 are different from electrical characteristics of a semiconductor component on the second region RG2, differences in performance between the semiconductor component of the first region RG1 and the semiconductor component of the second region RG2 may be reduced using the isolation patterns DB1 and DB2 having different widths. In addition, the differences in performance between the semiconductor component of the first region RG1 and the semiconductor component of the second region RG2 may also be reduced using the difference in the volume fraction between the first insulating pattern IP1 included in the diffusion barrier portion PO of the first isolation pattern DB1 and the first insulating pattern IP1 included in the diffusion barrier portion PO of the second isolation pattern DB2.

FIGS. 4, 6, 8, 10, 12, and 14 are plan views illustrating stages in a method for manufacturing a semiconductor device according to some embodiments. FIGS. 5A, 7A, 9A, 11A, 13A, and 15A are cross-sectional views taken along lines A-A' and B-B' of FIGS. 4, 6, 8, 10, 12, and 14, respectively. FIGS. 5B, 7B, 9B, 11B, 13B, and 15B are cross-sectional views taken along lines C-C' and D-D' of FIGS. 4, 6, 8, 10, 12, and 14, respectively.

Figure 4:
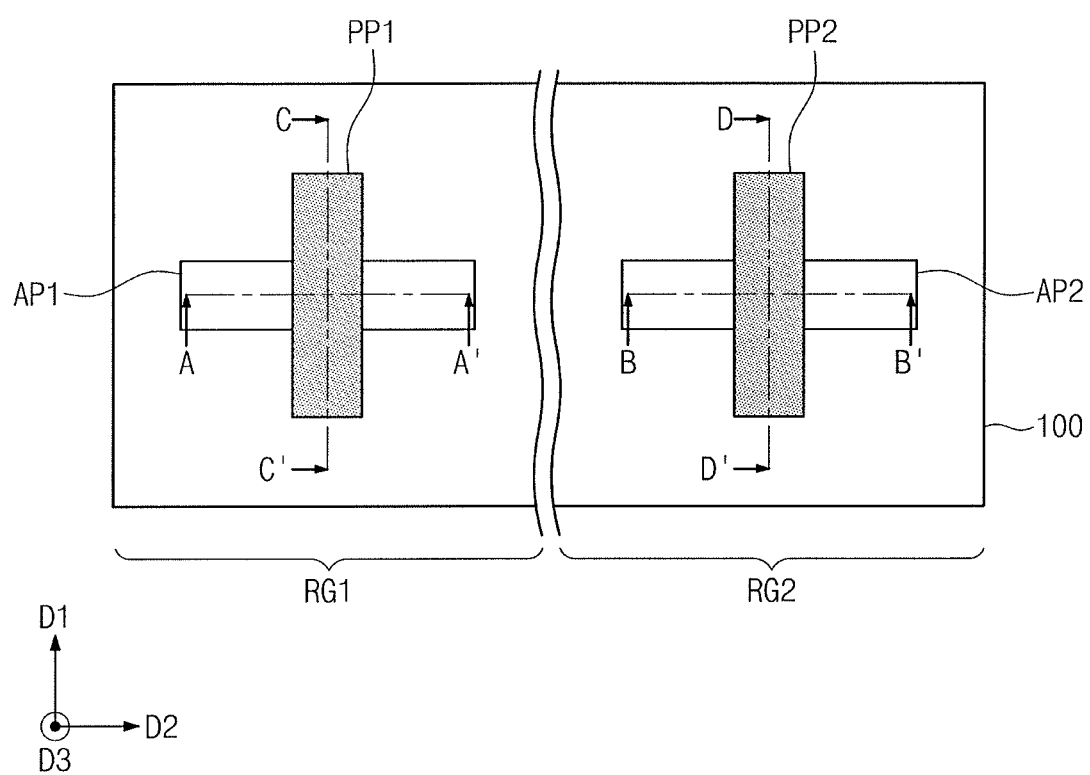
FIGS. 4, 6, 8, 10, 12, and 14 illustrate plan views of stages in a method for manufacturing a semiconductor device according to some embodiments.
Figure 5A:
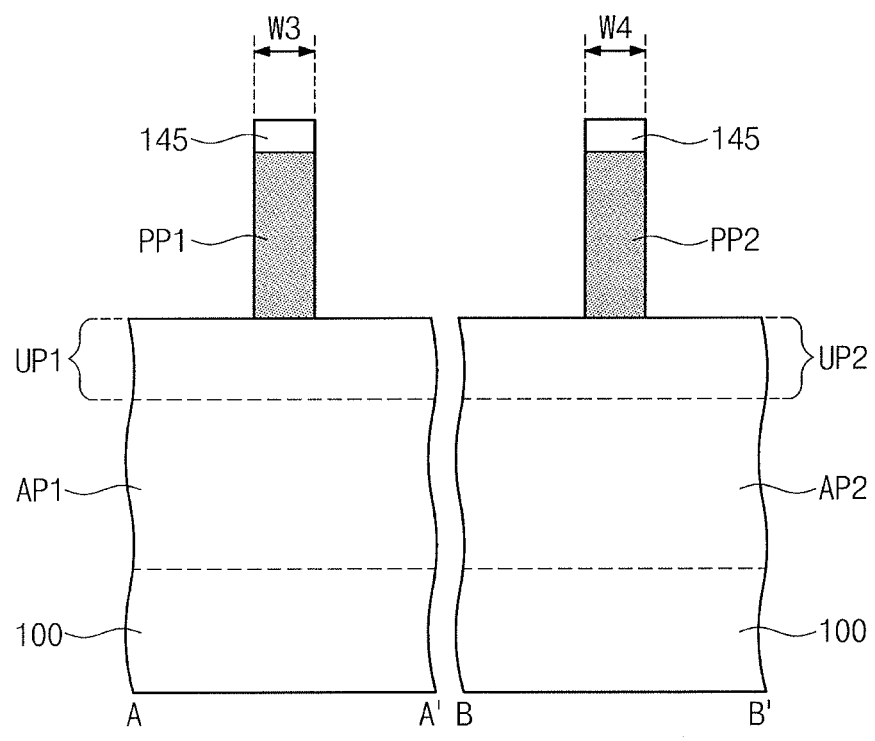
FIGS. 5A, 7A, 9A, 11A, 13A, and 15A illustrate cross-sectional views along lines A-A' and B-B' of FIGS. 4, 6, 8, 10, 12, and 14, respectively.
Figure 5B:
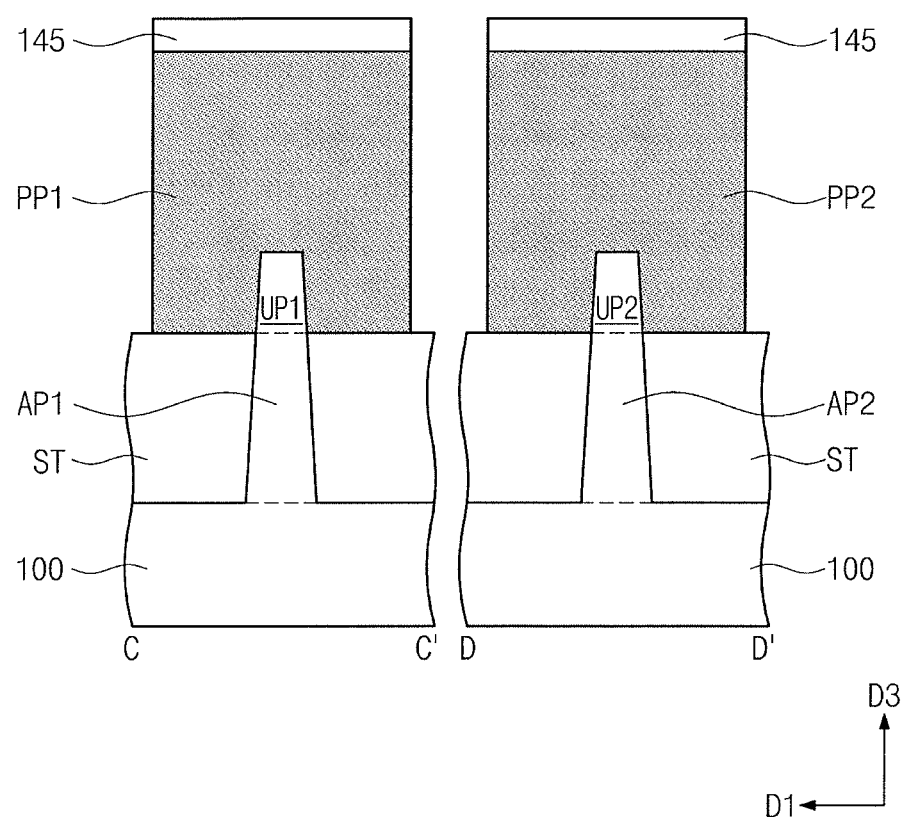
FIGS. 5B, 7B, 9B, 11B, 13B, and 15B illustrate cross-sectional views along lines C-C' and D-D' of FIGS. 4, 6, 8, 10, 12, and 14, respectively.

Referring to FIGS. 4, 5A, and 5B, the substrate 100 having the first region RG1 and the second region RG2 may be provided. The substrate 100 may be patterned to form the first and second active patterns AP1 and AP2. The first active pattern AP1 may be formed on the first region RG1, and the second active pattern AP2 may be formed on the second region RG2. In some embodiments, mask patterns may be formed on the substrate 100, and the substrate 100 may be anisotropically etched using the mask patterns as etch masks to form the first and second active patterns AP1 and AP2. The substrate 100 may be a semiconductor substrate including, e.g., silicon, germanium, or silicon-germanium, or may be a compound semiconductor substrate. In some embodiments, the substrate 100 may be a silicon substrate.

A device isolation layer ST may be formed on the substrate 100. An insulating layer (e.g., a silicon oxide layer) may be formed on an entire top surface of the substrate 100 to cover the first and second active patterns AP1 and AP2. Thereafter, the insulating layer may be etched or recessed until the upper portions UP1 and UP2 of the first and second active patterns AP1 and AP2 are exposed, thereby forming the device isolation layer ST, e.g., with the upper portions UP1 and UP2 protruding above the device isolation layer ST (FIG. 5B). For example, the first active pattern AP1 may be an active region of a PMOSFET, and the second active pattern AP2 may be an active region of an NMOSFET. However, embodiments are not limited thereto.

First and second sacrificial patterns PP1 and PP2 may be formed to intersect the first and second active patterns AP1 and AP2, respectively (FIG. 4). Each of the first and second sacrificial patterns PP1 and PP2 may have a line or bar shape extending in the first direction D1. The first sacrificial pattern PP1 on the first active pattern AP1 may have a third width W3 in the second direction D2, and the second sacrificial pattern PP2 on the second active pattern AP2 may have a fourth width W4 in the second direction D2 (FIG. 5A). The third width W3 may be substantially equal to the fourth width W4. In more detail, a sacrificial layer may be formed on the entire top surface of the substrate 100, and hard mask patterns 145 may be formed on the sacrificial layer. The sacrificial layer may be patterned using the hard mask patterns 145 as etch masks to form the first and second sacrificial patterns PP1 and PP2. The sacrificial layer may include, e.g., a poly-silicon layer.

Figure 6:
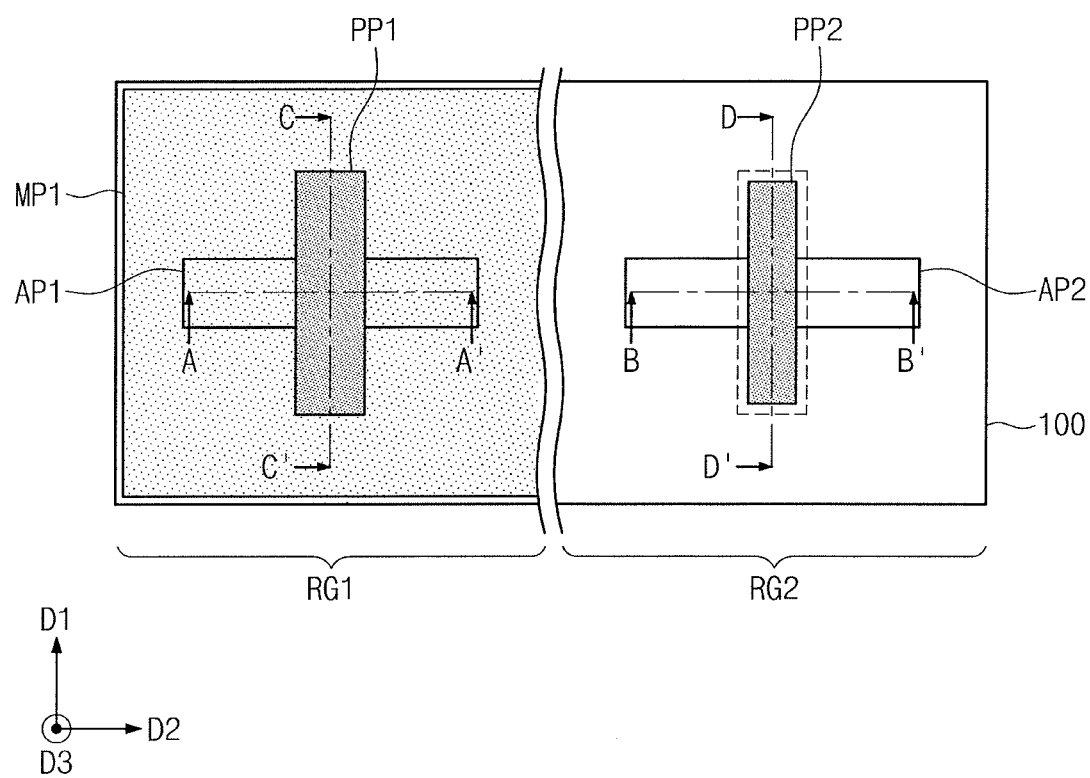
Figure 7A:
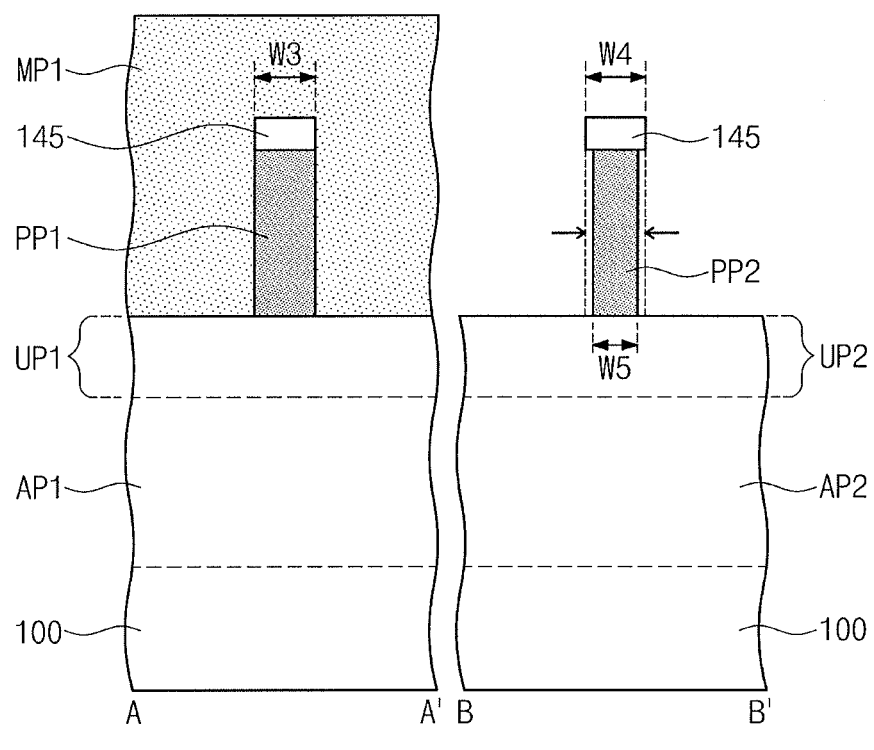
Figure 7B:
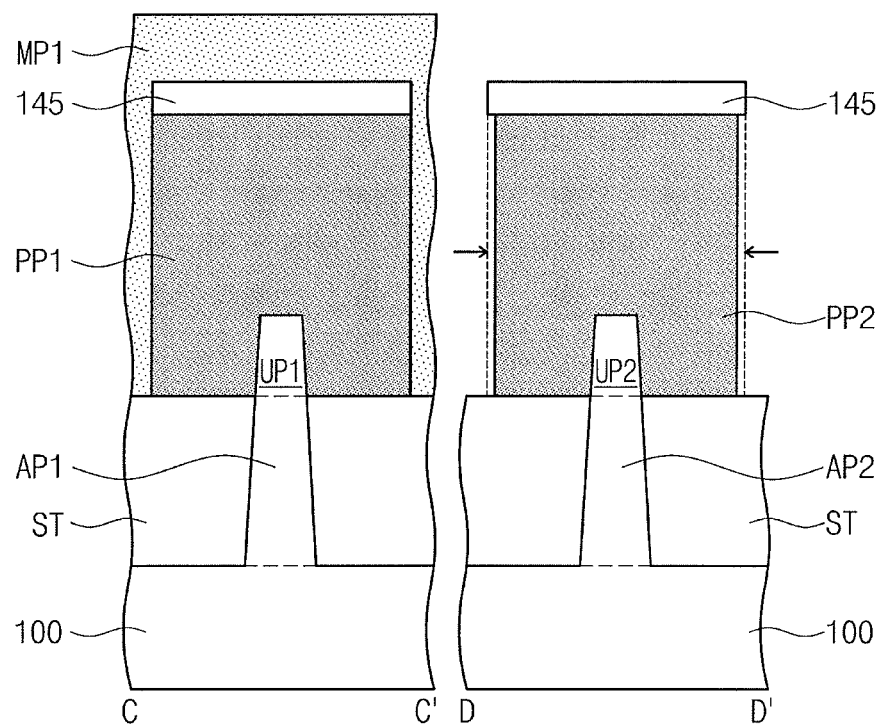

Referring to FIGS. 6, 7A, and 7B, a first mask pattern MP1 may be formed on the first region RG1 to cover the first active pattern AP1 and the first sacrificial pattern PP1. The first mask pattern MP1 may expose the second region RG2. A portion of the second sacrificial pattern PP2 may be etched using the first mask pattern MP1 as an etch mask. A size of the second sacrificial pattern PP2 may be reduced by the etching process. For example, the second sacrificial pattern PP2 may be etched to have a fifth width W5 in the second direction D2, which is smaller than the fourth width W4. On the other hand, the first sacrificial pattern PP1 may be protected by the first mask pattern MP1 during the etching process.

Figure 8:
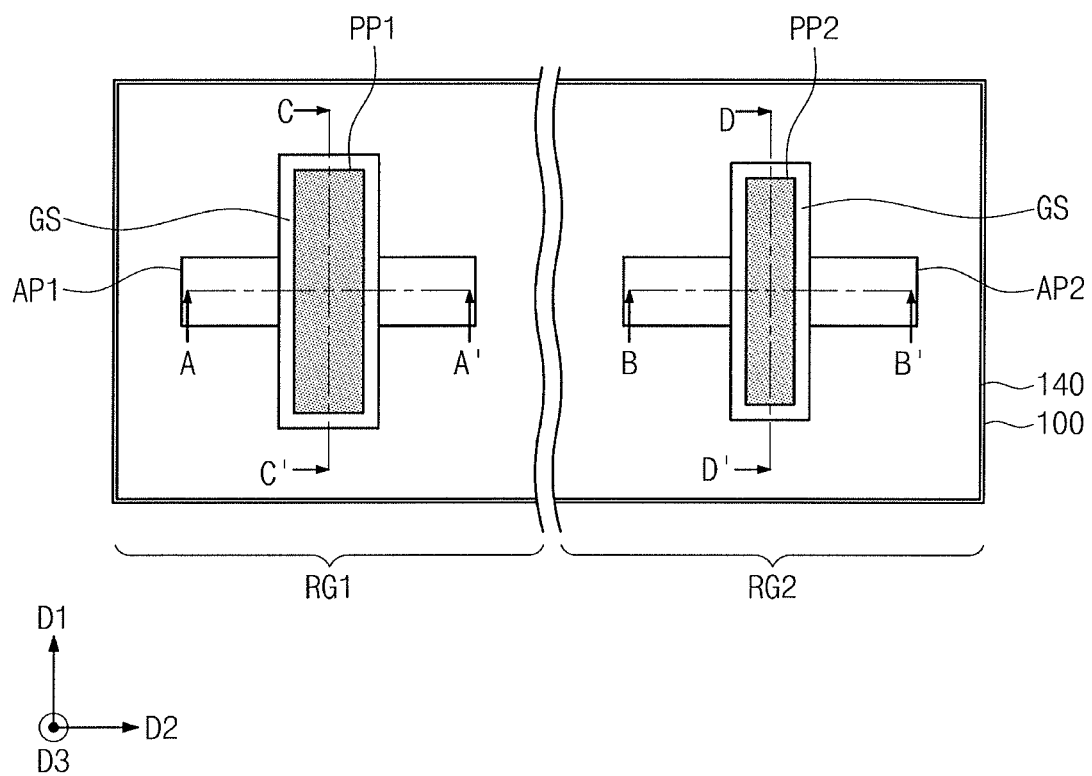
Figure 9A:
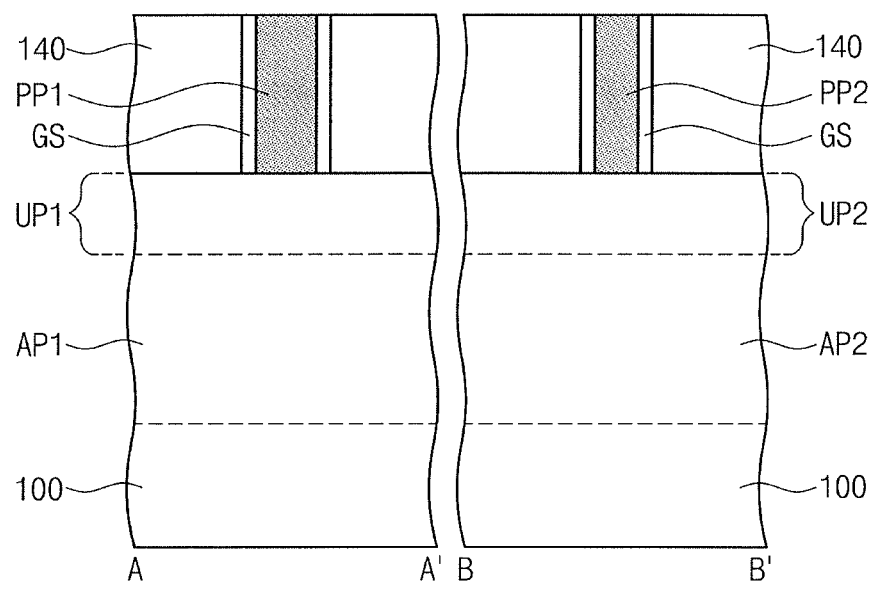
Figure 9A:
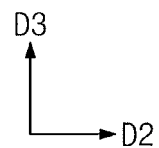
Figure 9B:
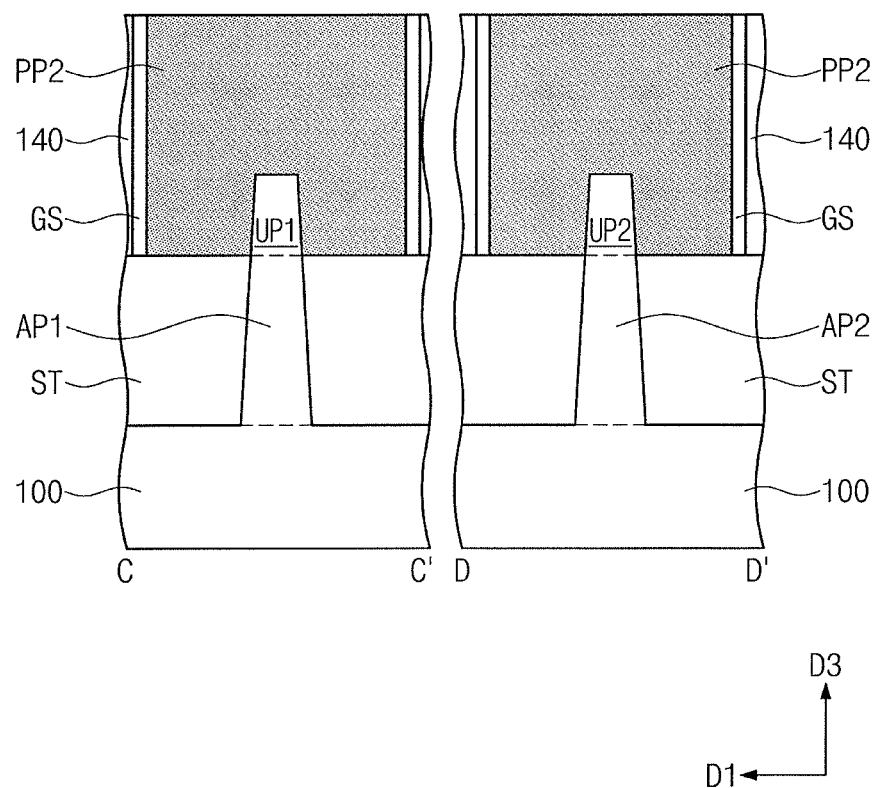

Referring to FIGS. 8, 9A, and 9B, the first mask pattern MP1 may be selectively removed. The gate spacers GS may be formed on sidewalls of the first and second sacrificial patterns PP1 and PP2. For example, a spacer layer may be conformally formed on the entire top surface of the substrate 100, and the spacer layer may be anisotropically etched to form the gate spacers GS. For example, the spacer layer may include at least one of $SiO_2$, SiCN, SiCON, or SiN. For another example, the spacer layer may be formed of a multi-layer including at least two of $SiO_2$, SiCN, SiCON, or SiN.

The interlayer insulating layer 140 may be formed on the entire top surface of the substrate 100. The interlayer insulating layer 140 may cover the gate spacers GS and the hard mask patterns 145. For example, the interlayer insulating layer 140 may include a silicon oxide layer.

The interlayer insulating layer 140 may be planarized until top surfaces of the first and second sacrificial patterns PP1 and PP2 are exposed. The planarization process of the interlayer insulating layer 140 may be performed using an etch-back process or a chemical mechanical polishing (CMP) process. The hard mask patterns 145 may be completely removed during the planarization process. As a result, a top surface of the interlayer insulating layer 140 may be substantially coplanar with the top surfaces of the first and second sacrificial patterns PP1 and PP2 and top surfaces of the gate spacers GS.

Figure 10:
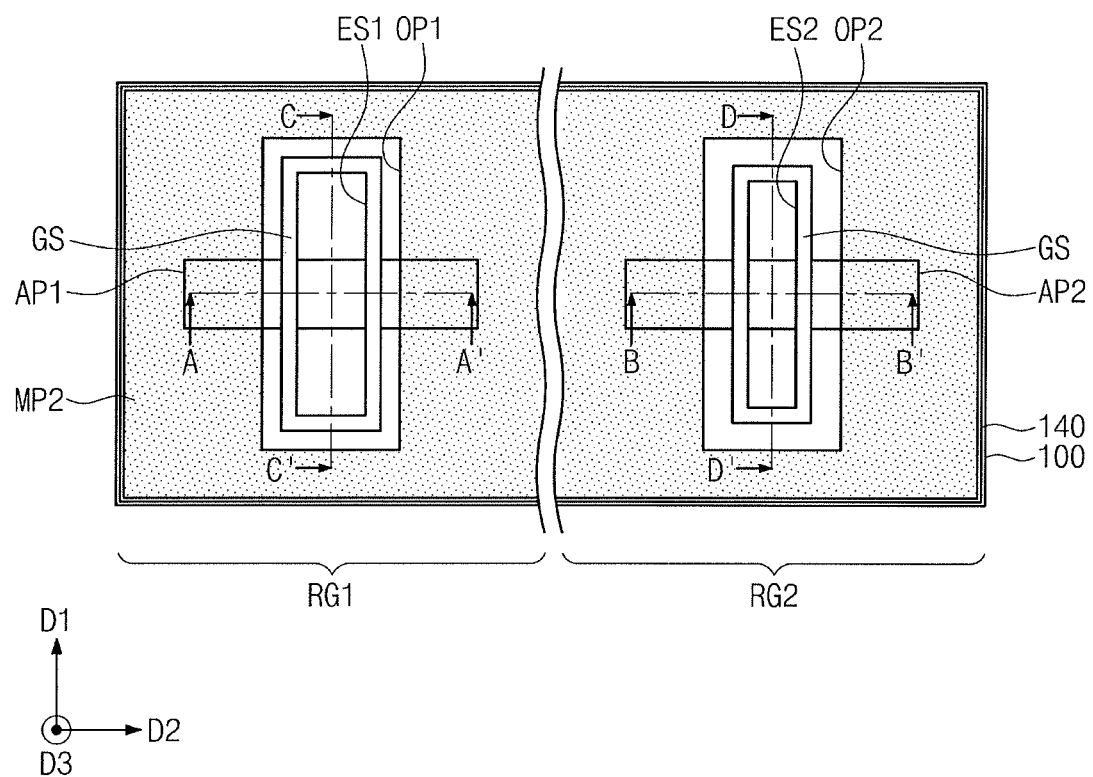
Figure 11A:
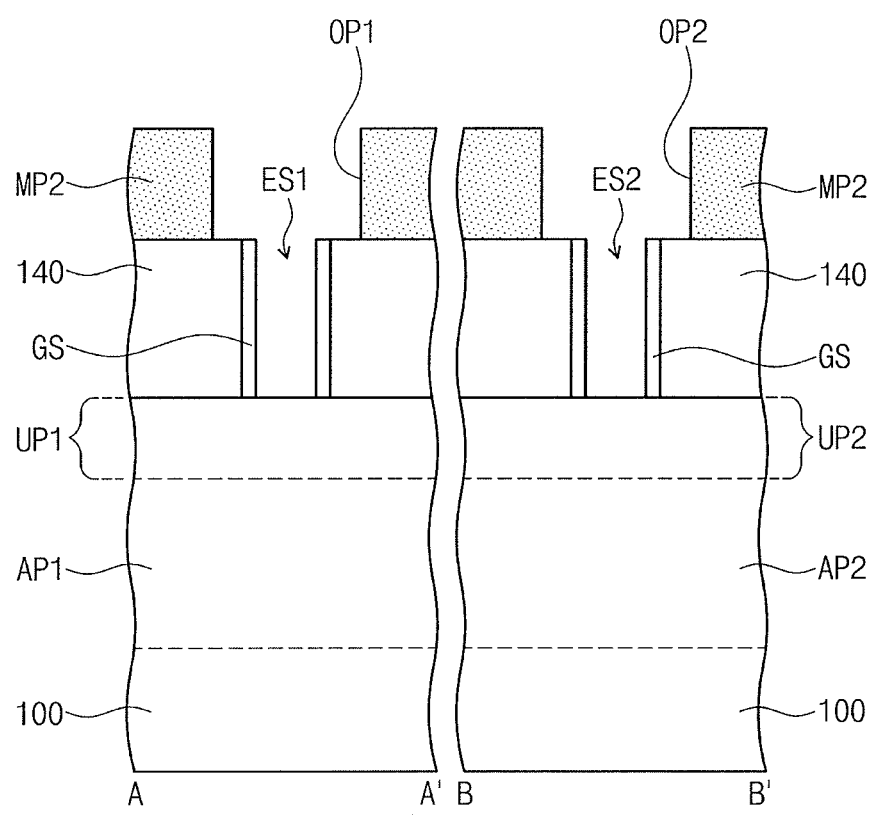
Figure 11B:
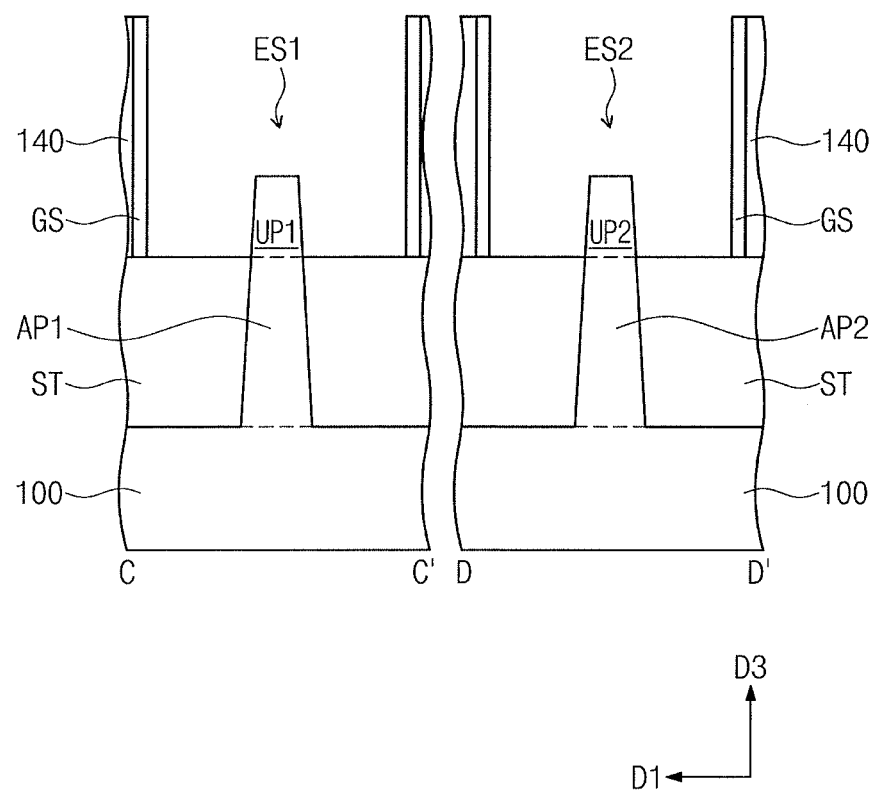

Referring to FIGS. 10, 11A, and 11B, a second mask pattern MP2 may be formed on the substrate 100. The second mask pattern MP2 may expose the first and second sacrificial patterns PP1 and PP2. The second mask pattern MP2 may have a first opening OP1 exposing the top surface of the first sacrificial pattern PP1 and a second opening OP2 exposing the top surface of the second sacrificial pattern PP2. In some embodiments, the second mask pattern MP2 may be formed of a multi-layer including a silicon oxide layer and a silicon nitride layer which are stacked.

The first and second sacrificial patterns PP1 and PP2 may be selectively removed through the first and second openings OP1 and OP2 of the second mask pattern MP2. First and second empty spaces ES1 and ES2 may be formed by the removal of the first and second sacrificial patterns PP1 and PP2, respectively. The first empty space ES1 may be defined by the gate spacers GS disposed on the first active pattern AP1, and the second empty space ES2 may be defined by the gate spacers GS disposed on the second active pattern AP2. The first empty space ES1 may expose the first upper portion UP1 of the first active pattern AP1, and the second empty space ES2 may expose the second upper portion UP2 of the second active pattern AP2.

A width of the first empty space ES1 in the second direction D2 may be substantially equal to the third width W3 of the first sacrificial pattern PP1 described above, and a width of the second empty space ES2 in the second direction D2 may be substantially equal to the fifth width W5 of the second sacrificial pattern PP2 described above. The width of the first empty space ES1 in the second direction D2 may be greater than the width of the second empty space ES2 in the second direction D2.

Figure 12:
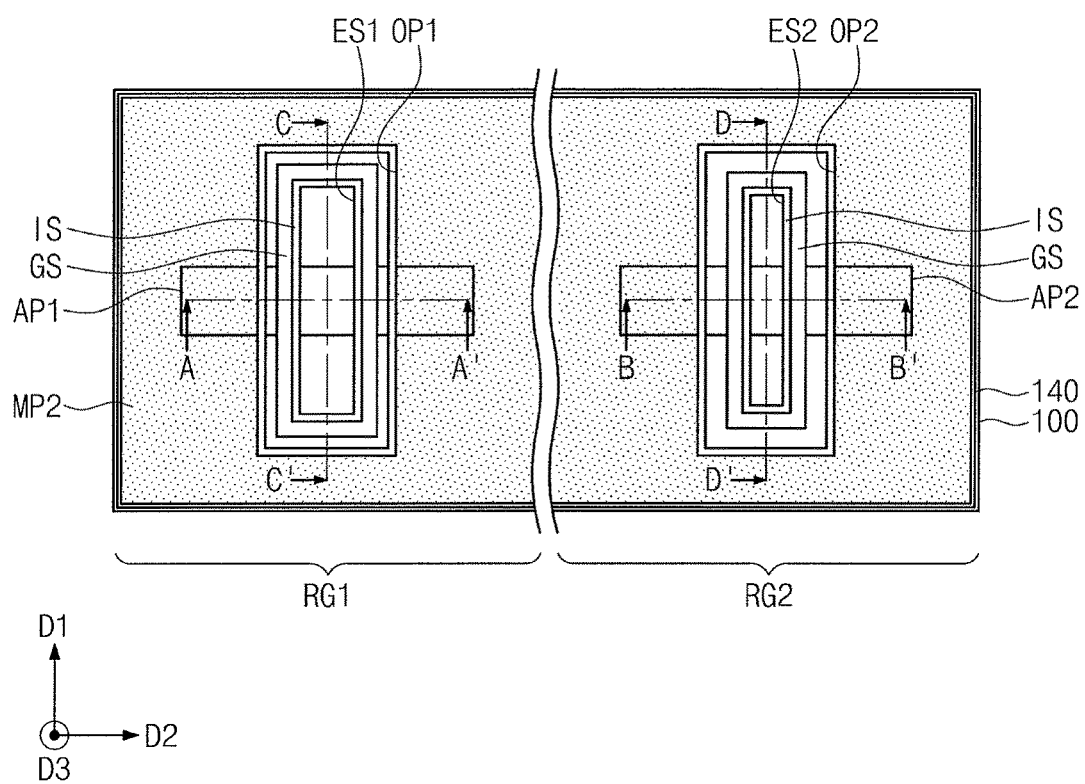
Figure 13A:
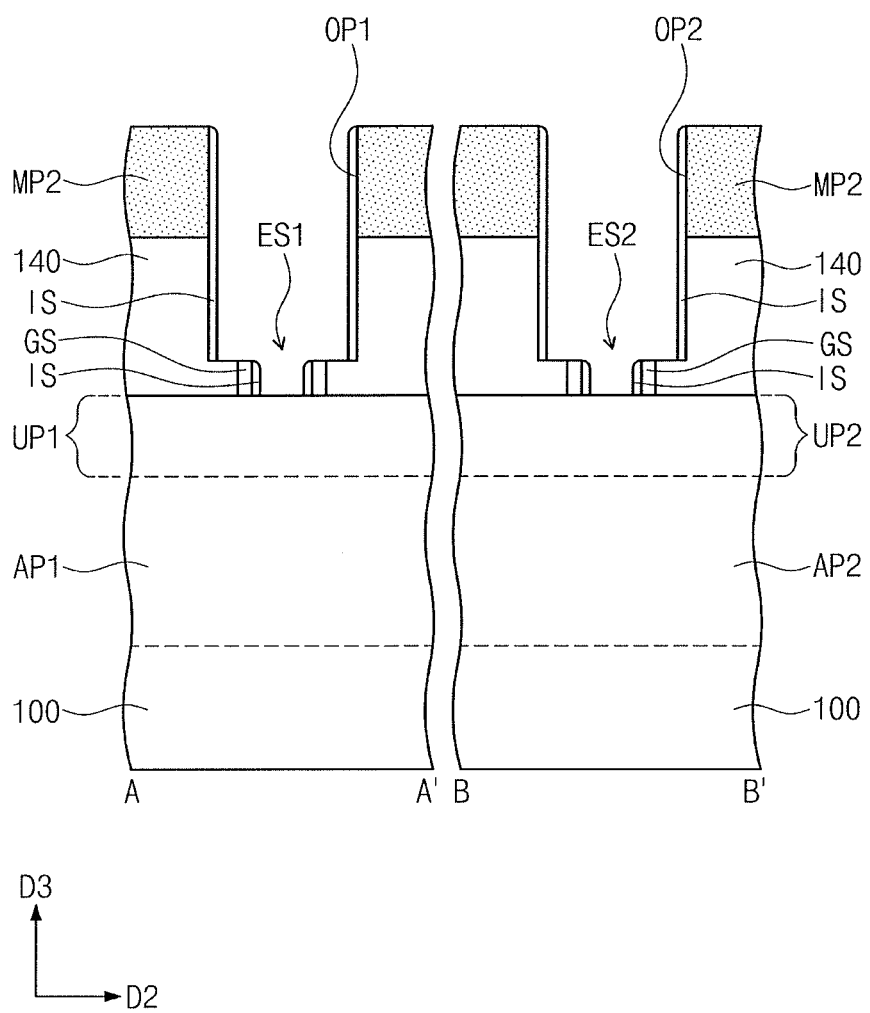
Figure 13B:
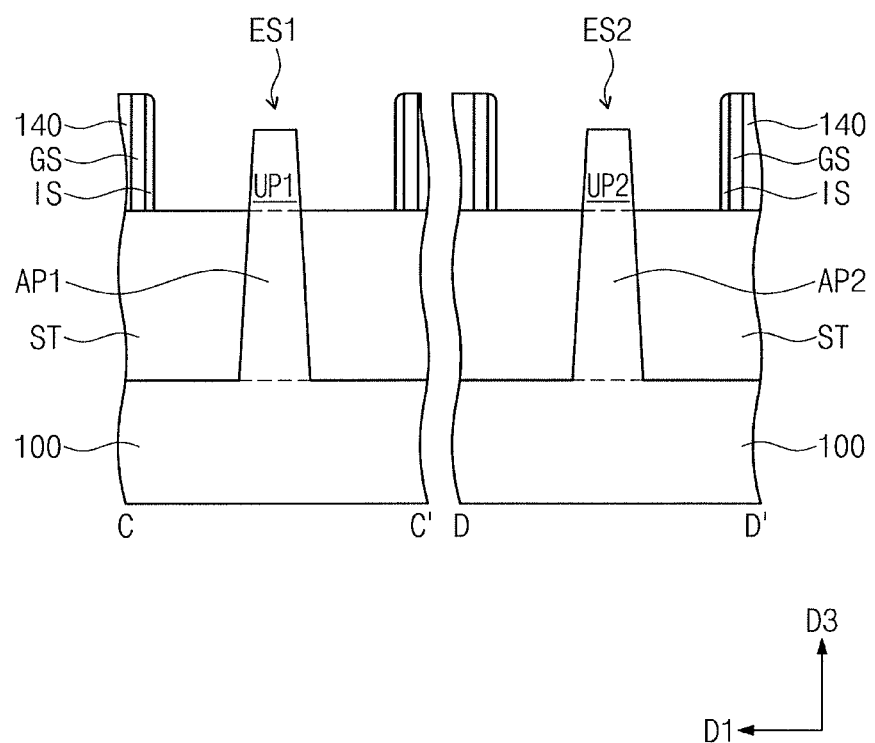

Referring to FIGS. 12, 13A, and 13B, an upper portion of the interlayer insulating layer 140 and upper portions of the gate spacers GS may be etched using the second mask pattern MP2 as an etch mask. Thus, the first and second openings OP1 and OP2 may extend toward the top surface of the substrate 100. The top surfaces of the gate spacers GS may be further lowered.

Insulating spacers IS may be formed in the first and second openings OP1 and OP2 and the first and second empty spaces ES1 and ES2. In some embodiments, an insulating spacer layer may be conformally faulted on the entire top surface of the substrate 100, and the insulating spacer layer may be anisotropically etched to form the insulating spacers IS. For example, the insulating spacer layer may include a silicon oxide layer. Sizes (e.g., widths) of the first and second openings OP1 and OP2 and sizes (e.g., widths) of the first and second empty spaces ES1 and ES2 may be reduced by the insulating spacers IS. A thickness of the insulating spacer IS in the first empty space ES1 may be substantially equal to a thickness of the insulating spacer IS in the second empty space ES2. In certain embodiments, the formation of the insulating spacers IS may be omitted.

Figure 14:
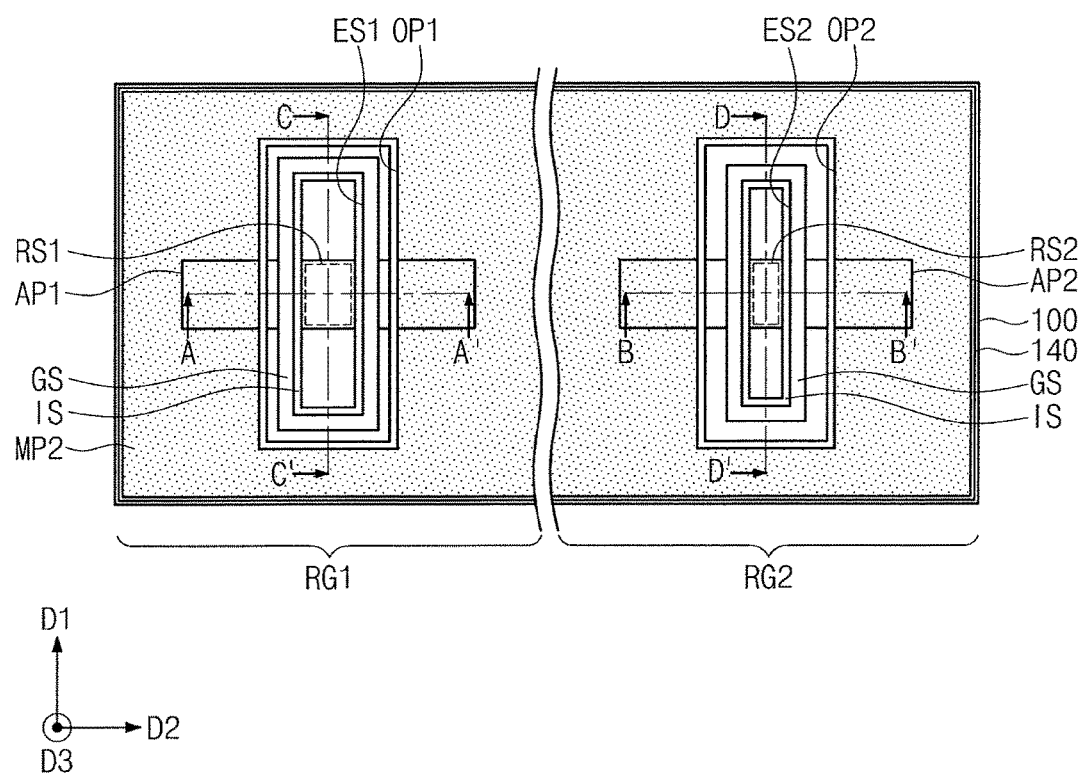
Figure 15A:
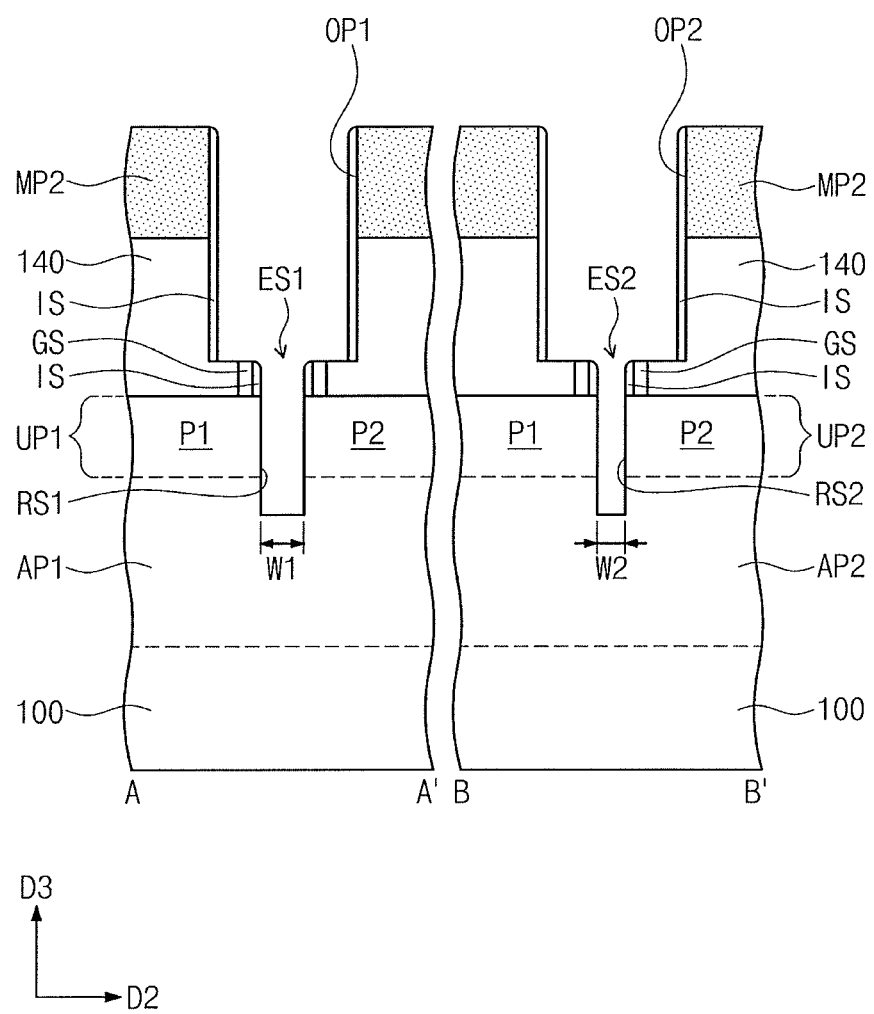
Figure 15B:
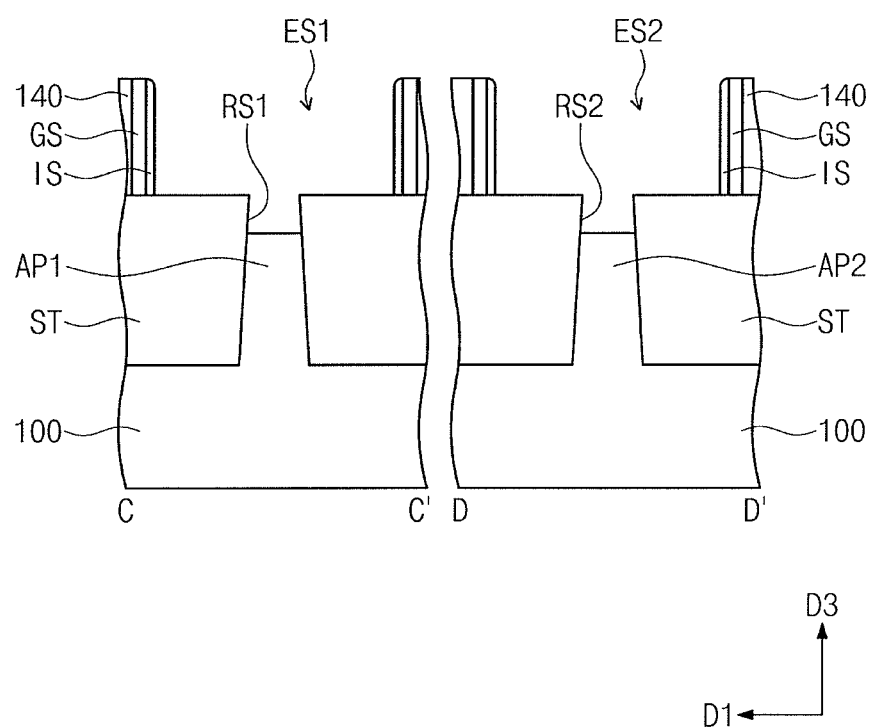

Referring to FIGS. 14, 15A, and 15B, the first and second upper portions UP1 and UP2 of the first and second active patterns AP1 and AP2, which are exposed through the first and second empty spaces ES1 and ES2, may be selectively etched to form first and second recess regions RS1 and RS2, respectively. The first and second recess regions RS1 and RS2 may be connected to the first and second empty spaces ES1 and ES2, respectively. The process of etching the first and second active patterns AP1 and AP2 may be performed until bottoms of the first and second recess regions RS1 and RS2 become lower than a top surface of the device isolation layer ST.

The first recess region RS1 may divide the first upper portion UP1 of the first active pattern AP1 into a first portion P1 and a second portion P2, and the second recess region RS2 may divide the second upper portion UP2 of the second active pattern AP2 into a first portion P1 and a second portion P2. The first recess region RS1 may have a first width W1 in the second direction D2, and the second recess region RS2 may have a second width W2 in the second direction D2. The first width W1 may be greater than the second width W2.

Referring again to FIGS. 1, 2A, and 2B, the first isolation pattern DB1 may be formed to fill the first recess region RS1 and the first empty space ES1, and the second isolation pattern DB2 may be formed to fill the second recess region RS2 and the second empty space ES2. The first and second isolation patterns DB1 and DB2 may be formed at the same time.

The formation of the first and second isolation patterns DB1 and DB2 may include forming the first insulating patterns IP1 in the first and second recess regions RS1 and RS2 and the first and second empty spaces ES1 and ES2, and forming the second insulating patterns IP2 on the first insulating patterns IP1.

The formation of the first insulating patterns IP1 may include conformally forming a first insulating layer on the entire top surface of the substrate 100 and selectively etching the first insulating layer disposed in the first and second openings OP1 and OP2. Thus, the first insulating patterns IP1 may remain in only the first and second recess regions RS1 and RS2 and the first and second empty spaces ES1 and ES2. For example, the first insulating layer may include a silicon nitride layer or a silicon oxynitride layer.

The formation of the second insulating patterns IP2 may include forming a second insulating layer on the entire top surface of the substrate 100, after formation of the first insulating patterns IP1, and planarizing the second insulating layer until the top surface of the interlayer insulating layer 140 is exposed. Thus, the second insulating patterns IP2 may completely fill the first and second empty spaces ES1 and ES2. Top surfaces of the second insulating patterns IP2 may be substantially coplanar with the top surface of the interlayer insulating layer 140. In some embodiments, the second mask pattern MP2 may be removed by the process of planarizing the second insulating layer. For example, the second insulating layer may include a silicon oxide layer.

The first insulating pattern IP1 on the first region RG1 may be formed to fill a portion of the first recess region RS1 and a portion of the first empty space ES1. The second insulating pattern IP2 on the first region RG1 may be formed to fill the rest of the first recess region RS1 and the rest of the first empty space ES1. The first insulating pattern IP1 on the second region RG2 may be formed to fill a portion of the second recess region RS2 and a portion of the second empty space ES2. The second insulating pattern IP2 on the second region RG2 may be formed to fill the rest of the second recess region RS2 and the rest of the second empty space ES2.

In the aforementioned embodiments, the second sacrificial pattern PP2 of the second region RG2 may be selectively and partially etched, and thus the size of the second sacrificial pattern PP2 may become smaller than that of the first sacrificial pattern PP1 of the first region RG1. The first and second recess regions RS1 and RS2 having different sizes may be formed using the first and second sacrificial patterns PP1 and PP2 having different sizes, respectively. The width W1 of the first isolation pattern DB1 filling the first recess region RS1 may be greater than the width W2 of the second isolation pattern DB2 filling the second recess region RS2.

FIGS. 16, 17, 18, and 19 are cross-sectional views taken along lines A-A' and B-B' of FIG. 1 to illustrate semiconductor devices according to some embodiments. In the present embodiments, the descriptions to the same technical features as in the embodiments of FIGS. 1, 2A, 2B, and 3 will be omitted or mentioned briefly for the purpose of ease and convenience in explanation. In other words, differences between the present embodiments and the embodiments of FIGS. 1, 2A, 2B, and 3 will be mainly described hereinafter.

Figure 16:
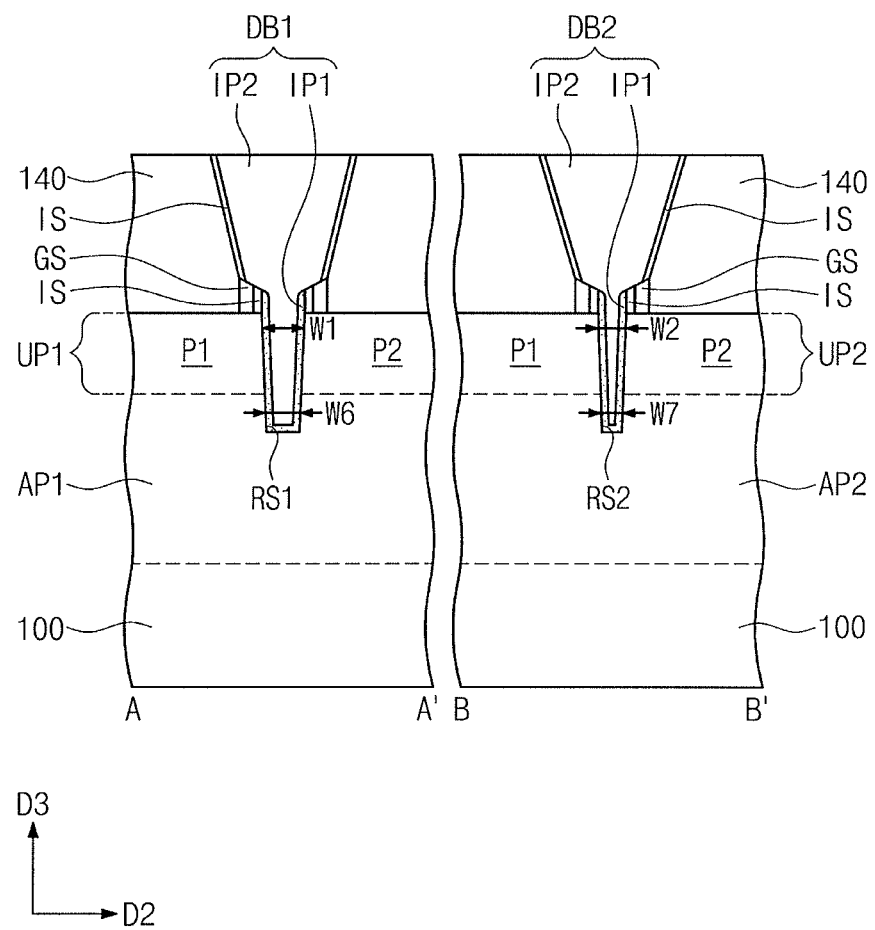
FIGS. 16, 17, 18, and 19 illustrate cross-sectional views along lines A-A' and B-B' of FIG. 1 to illustrate semiconductor devices according to some embodiments.

Referring to FIG. 16, a width of the first recess region RS1 in the second direction D2 may become progressively smaller from an upper portion toward a lower portion of the first recess region RS1. For example, the width W1 of the upper portion of the first recess region RS1 may be greater than a width W6 of the lower portion of the first recess region RS1.

A width of the second recess region RS2 in the second direction D2 may become progressively smaller from an upper portion toward a lower portion of the second recess region RS2. For example, the width W2 of the upper portion of the second recess region RS2 may be greater than a width W7 of the lower portion of the second recess region RS2.

Widths of the first and second isolation patterns DB1 and DB2 in the second direction D2 may become progressively smaller from their upper portions toward their lower portions. Thicknesses of the insulating spacers IS disposed between the gate spacers GS and the isolation patterns DB1 and DB2 may be greater than thicknesses of the insulating spacers IS disposed between the interlayer insulating layer 140 and the isolation patterns DB1 and DB2.

Figure 17:
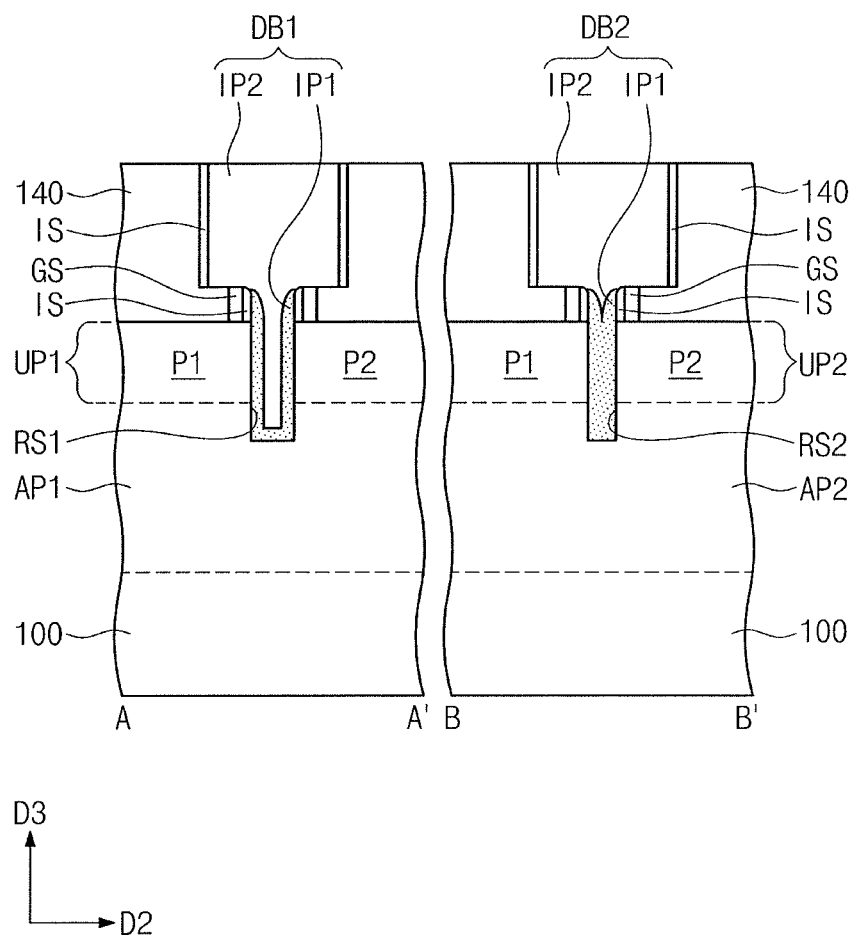

Referring to FIG. 17, the first insulating pattern IP1 of the second isolation pattern DB2 may completely fill the second recess region RS2. In other words, a volume fraction of the first insulating pattern IP1 with respect to the volume of the second recess region RS2 may be about 100%. That is, the volume of the first insulating pattern IP1 disposed in the second recess region RS2 may be substantially equal to the volume of the second recess region RS2. The second insulating pattern IP2 of the second isolation pattern DB2 may not exist in the second recess region RS2.

Figure 18:
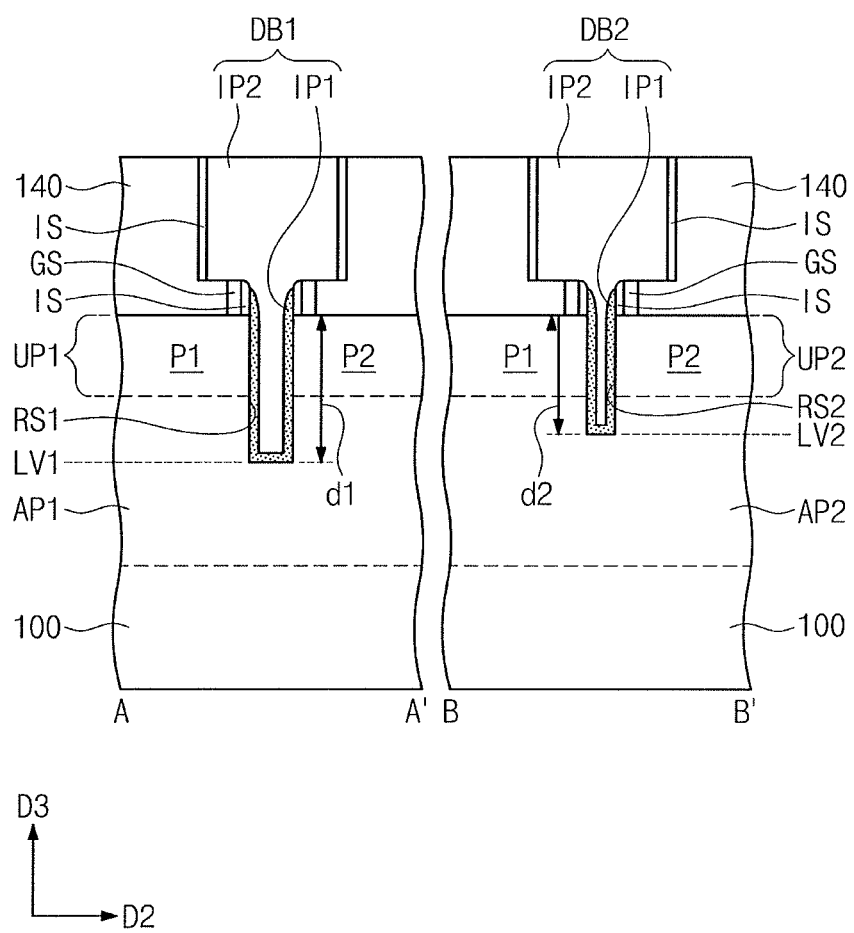

Referring to FIG. 18, the first recess region RS1 may have a first depth d1, and the second recess region RS2 may have a second depth d2. Here, the first depth d1 may be greater than the second depth d2. The first depth d1 may be a vertical distance from the top surface of the first upper portion UP1 of the first active pattern AP1 to the bottom of the first recess region RS1. The second depth d2 may be a vertical distance from the top surface of the second upper portion UP2 of the second active pattern AP2 to the bottom of the second recess region RS2.

Since the first recess region RS1 is deeper than the second recess region RS2, a level LV1 of the bottom surface of the first isolation pattern DB1 in the first recess region RS1 may be lower than a level LV2 of the bottom surface of the second isolation pattern DB2 in the second recess region RS2.

Figure 19:
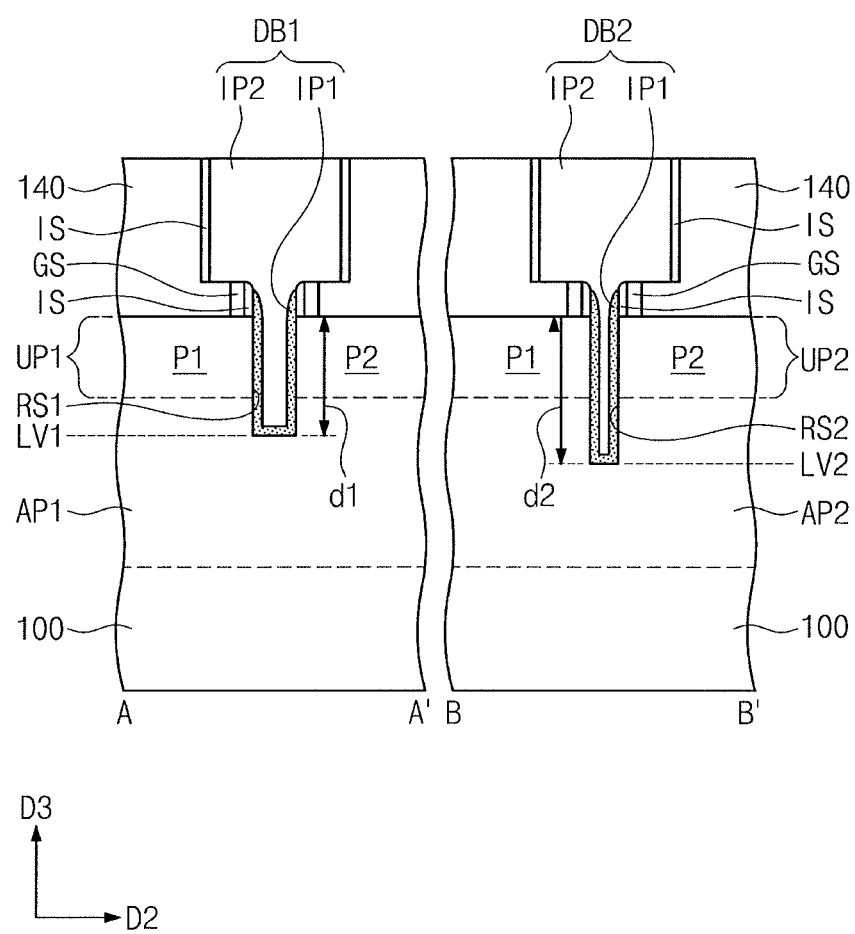

Referring to FIG. 19, the first recess region RS1 may have a first depth d1, and the second recess region RS2 may have a second depth d2. Here, the second depth d2 may be greater than the first depth d1. Since the second recess region RS2 is deeper than the first recess region RS1, a level LV1 of the bottom surface of the first isolation pattern DB1 in the first recess region RS1 may be higher than a level LV2 of the bottom surface of the second isolation pattern DB2 in the second recess region RS2.

Figure 20:
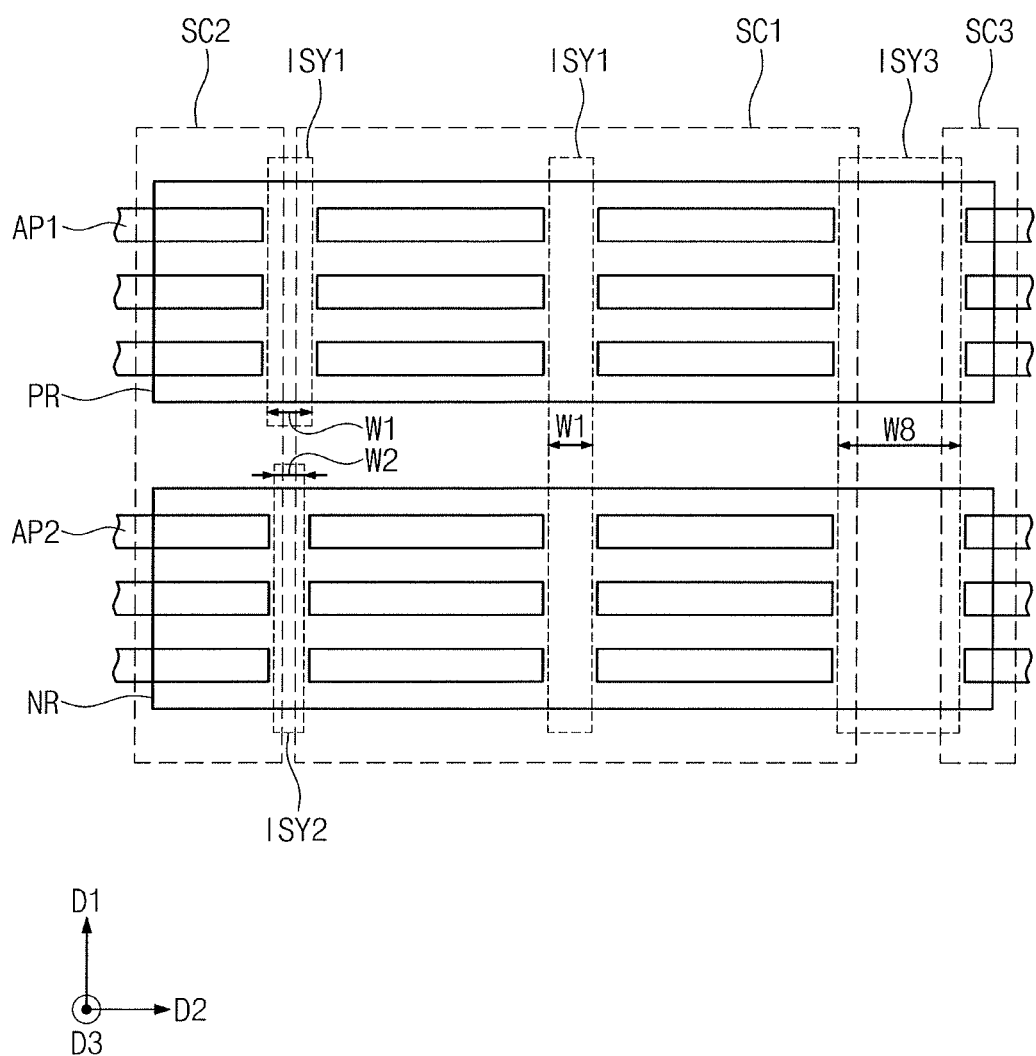
FIG. 20 illustrates a plan view of active patterns of a semiconductor device according to some embodiments.

FIG. 20 is a plan view illustrating active patterns of a semiconductor device according to some embodiments.

Referring to FIG. 20, the substrate 100 having first to third cell regions SC1, SC2, and SC3 may be provided. For example, the substrate 100 may be a semiconductor substrate including silicon, germanium, or silicon-germanium, or may be a compound semiconductor substrate.

The first to third cell regions SC1, SC2, and SC3 may be arranged in the second direction D2. The first cell region SC1 may be disposed between the second and third cell regions SC2 and SC3. Each of the first to third cell regions SC1, SC2, and SC3 may be a logic cell region on which logic transistors constituting a logic circuit of a semiconductor device are disposed. FIG. 20 illustrates arrangement of first and second active patterns AP1 and AP2 on which the logic transistors will be formed. In some embodiments, logic transistors constituting a processor core or an input/output (I/O) terminal may be disposed on each of the first to third cell regions SC1, SC2, and SC3. Each of the first to third cell regions SC1, SC2, and SC3 may be a portion of the processor core or the I/O terminal. The logic transistors to be formed on the first to third cell regions SC1, SC2, and SC3 will be described later in more detail with reference to FIGS. 21, 22A to 22E, 23A, and 23B.

The first active patterns AP1 may be disposed on a PMOSFET region PR of the substrate 100, and the second active patterns AP2 may be disposed on an NMOSFET region NR of the substrate 100. The PMOSFET region PR and the NMOSFET region NR may extend in the second direction D2 in parallel to each other. The PMOSFET region PR and the NMOSFET region NR may be spaced apart from each other in the first direction D1. The first active patterns AP1 may extend in the second direction D2 on the PMOSFET region PR in parallel to each other, and the second active patterns AP2 may extend in the second direction D2 on the NMOSFET region NR in parallel to each other.

First isolation regions ISY1, a second isolation region ISY2, and a third isolation region ISY3 may be disposed at the substrate 100. The first to third isolation regions ISY1, ISY2, and ISY3 may be diffusion break regions, diffusion blocking regions, or diffusion barrier regions. The first to third isolation regions ISY1, ISY2, and ISY3 may extend in the first direction D1 in parallel to each other. The first isolation region ISY1 and the second isolation region ISY2 may be disposed on a boundary between the first and second cell regions SC1 and SC2. The first and second isolation regions ISY1 and ISY2 may be spaced apart from each other and be aligned with each other in the first direction D1 on the boundary between the first and second cell regions SC1 and SC2. The third isolation region ISY3 may be disposed on a boundary between the first and third cell regions SC1 and SC3. Another of the first isolation regions ISY1 may be disposed in the first cell region SC1.

The first and second active patterns AP1 and AP2 may be isolated from each other by the first to third isolation regions ISY1, ISY2, and ISY3. For example, the first isolation region ISY1 may isolate the first active patterns AP1 of the first cell region SC1 from the first active patterns AP1 of the second cell region SC2 in the second direction D2. The second isolation region ISY2 may isolate the second active patterns AP2 of the first cell region SC1 from the second active patterns AP2 of the second cell region SC2 in the second direction D2. The third isolation region ISY3 may isolate the first and second active patterns AP1 and AP2 of the first cell region SC1 from the first and second active patterns AP1 and AP2 of the third cell region SC3 in the second direction D2.

The width W1 of each of the first isolation regions ISY1 may be greater than the width W2 of the second isolation region ISY2. A width W8 of the third isolation region ISY3 may be greater than the width W1 of each of the first isolation regions ISY1.

In some embodiments, each of the first isolation regions ISY1 may correspond to the first recess region RS1 described with reference to FIGS. 1, 2A, 2B, and 3, and the second isolation region ISY2 may correspond to the second recess region RS2 described with reference to FIGS. 1, 2A, 2B, and 3.

Figure 21:
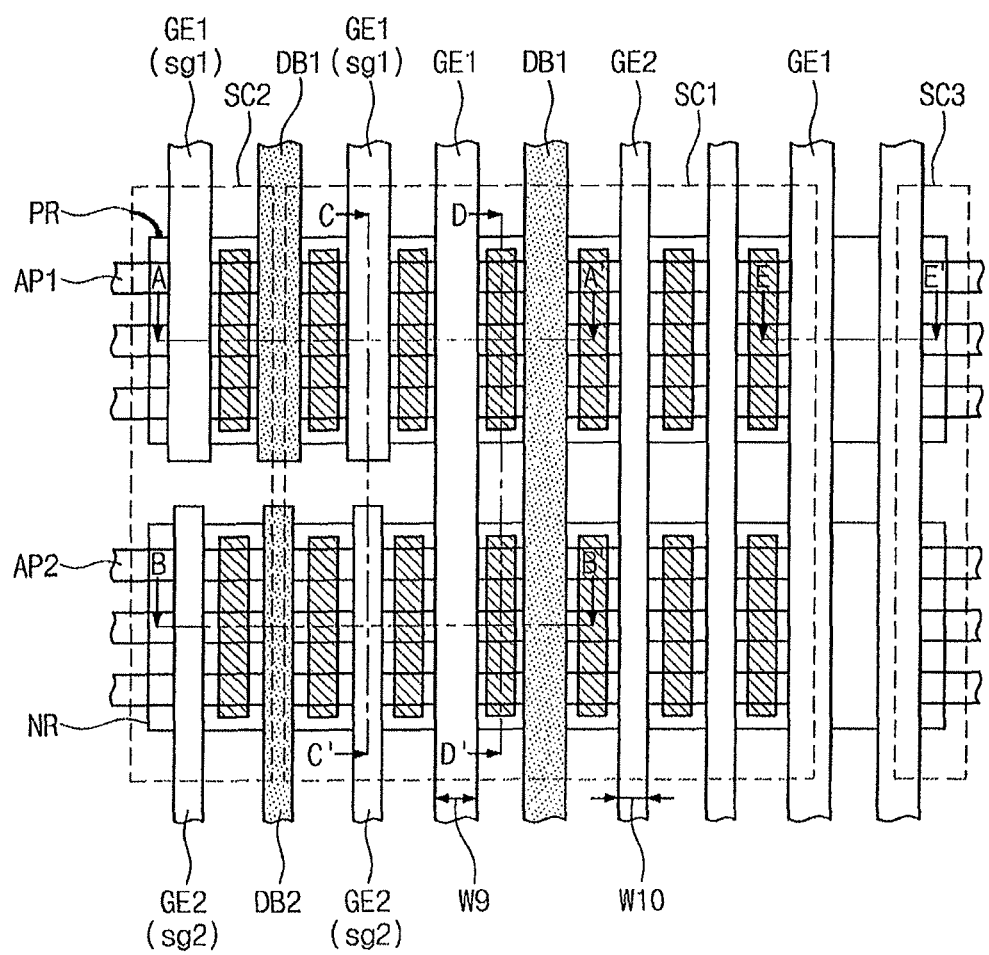
FIG. 21 illustrates a plan view of a semiconductor device according to some embodiments.
Figure 22A:
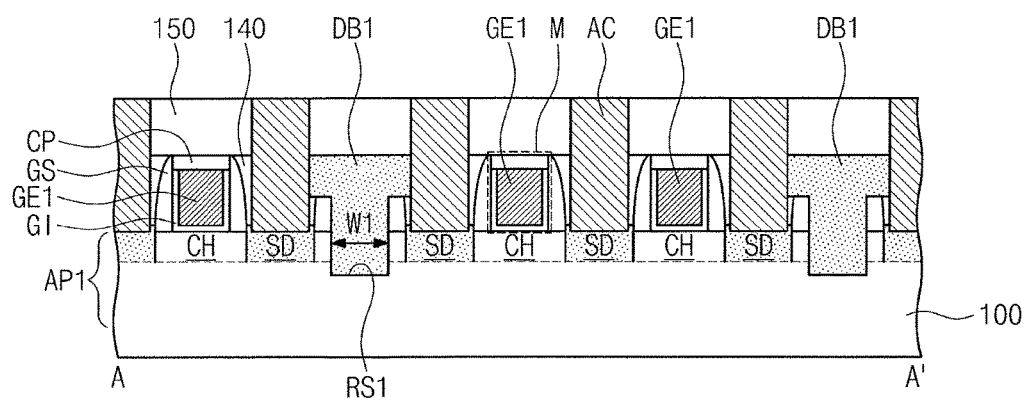
FIGS. 22A to 22E illustrate cross-sectional views along lines A-A', B-B', C-C', D-D', and E-E' of FIG. 21, respectively.
Figure 22A:
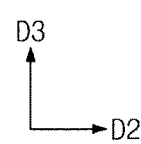
Figure 22B:
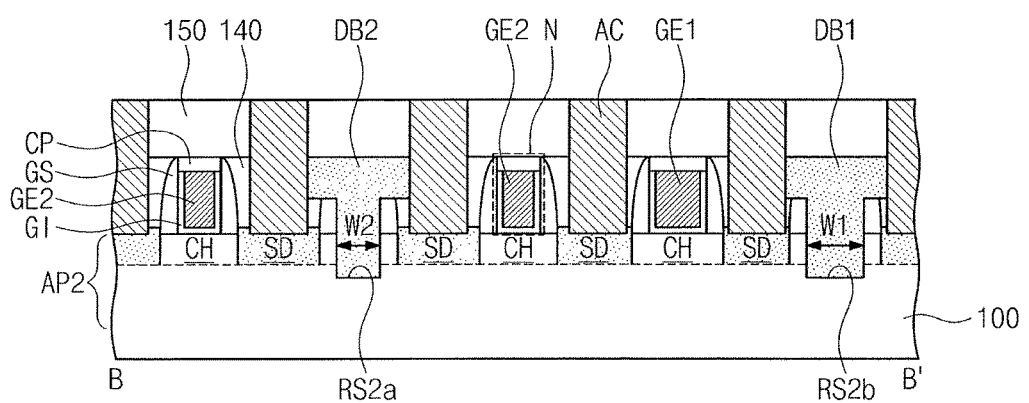
Figure 22B:
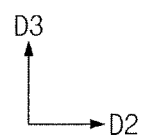
Figure 22C:
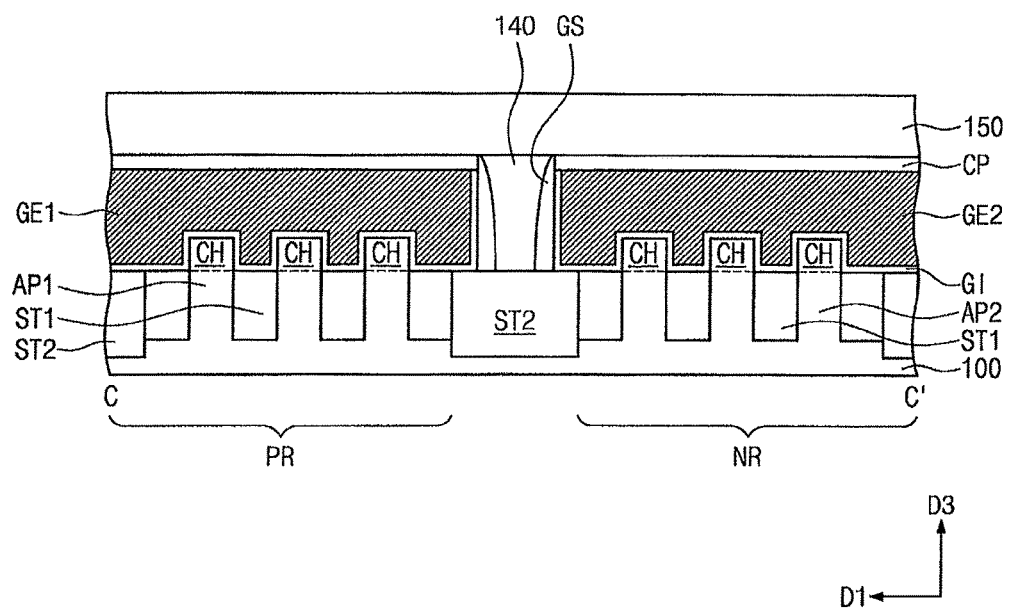
Figure 22D:
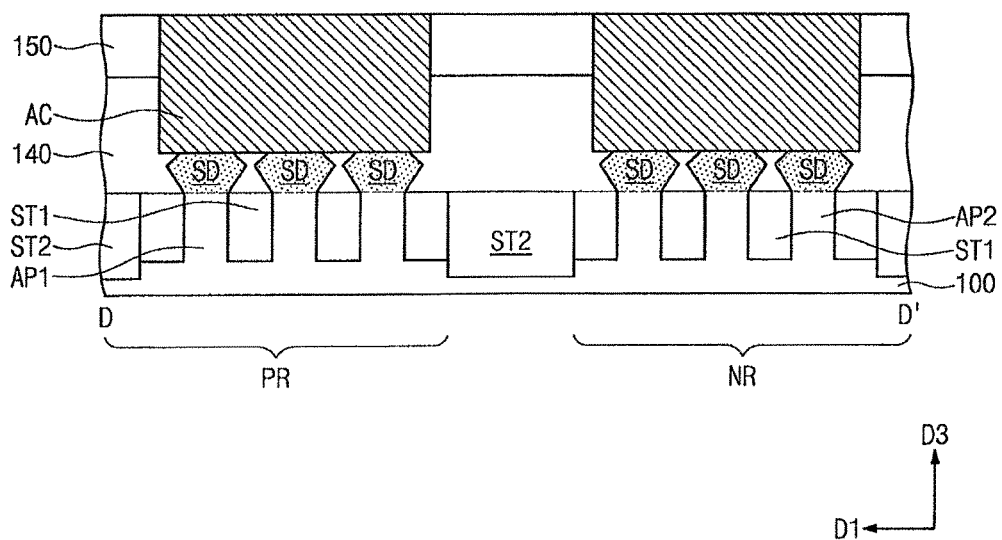
Figure 22E:
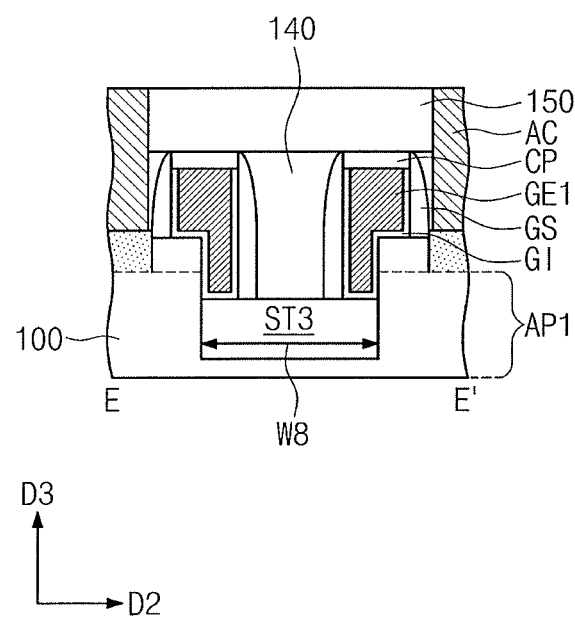
Figure 23A:
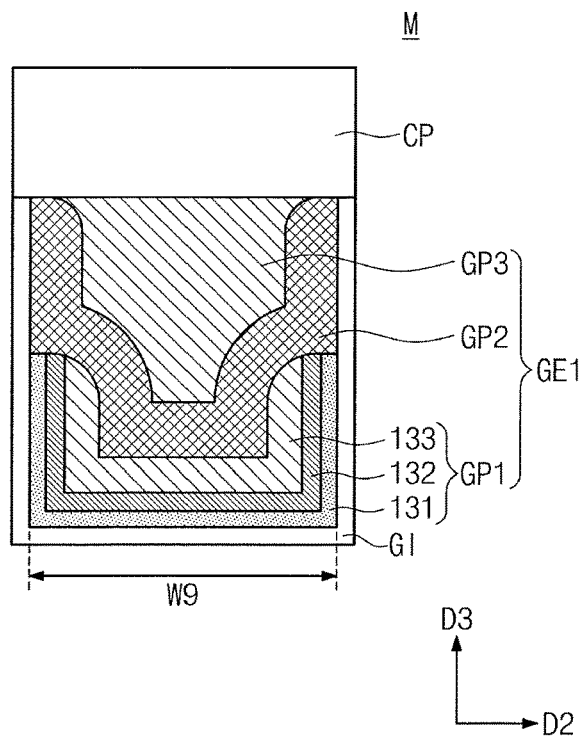
FIG. 23A illustrates an enlarged view of a portion 'M' of a first gate electrode of FIG. 22A.
Figure 23B:
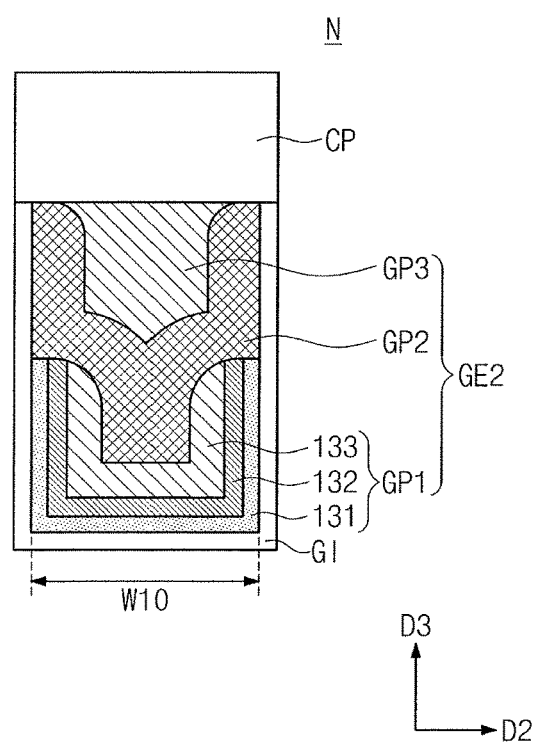
FIG. 23B illustrates an enlarged view of a portion 'N' of a second gate electrode of FIG. 22B.

FIG. 21 is a plan view illustrating a semiconductor device according to some embodiments. FIGS. 22A to 22E are cross-sectional views taken along lines A-A', B-B', C-C', D-D', and E-E' of FIG. 21, respectively. FIG. 23A is an enlarged view of a portion 'M' of a first gate electrode of FIG. 22A, and FIG. 23B is an enlarged view of a portion 'N' of a second gate electrode of FIG. 22B. In the present embodiment, the descriptions to the same technical features as in the embodiments of FIGS. 1, 2A, 2B, and 3 will be omitted or mentioned briefly for the purpose of ease and convenience in explanation. In other words, differences between the present embodiment and the embodiments of FIGS. 1, 2A, 2B, and 3 will be mainly described hereinafter.

Referring to FIGS. 20, 21, 22A to 22E, 23A, and 23B, first to third device isolation layers ST1, ST2, and ST3 may be provided on the substrate 100 of FIG. 20.

The first device isolation layers ST1 may define the first and second active patterns AP1 and AP2. In more detail, the first device isolation layers ST1 may be disposed at both sides of each of the first and second active patterns AP1 and AP2 and may extend in the second direction D2.

The second device isolation layers ST2 may define the PMOSFET region PR and the NMOSFET region NR of the substrate 100. The PMOSFET region PR and the NMOSFET region NR may be spaced apart from each other in the first direction D1 with the second device isolation layer ST2 interposed therebetween.

The third device isolation layer ST3 may be disposed on the boundary between the first and third cell regions SC1 and SC3. The third device isolation layer ST3 may be provided in the third isolation region ISY3 described above with reference to FIG. 20. The first and second active patterns AP1 and AP2 of the third cell region SC3 may be isolated from the first and second active patterns AP1 and AP2 of the first cell region SC1 in the second direction D2 by the third device isolation layer ST3.

Upper portions of the first and second active patterns AP1 and AP2 may be higher than top surfaces of the first to third device isolation layers ST1, ST2, and ST3. The upper portions of the first and second active patterns AP1 and AP2 may vertically protrude from between the first device isolation layers ST1. Each of the upper portions of the first and second active patterns AP1 and AP2 may have a fin-shape protruding from between a pair of the first device isolation layers ST1.

Channel regions CH and source/drain regions SD may be provided in the upper portions of the first and second active patterns AP1 and AP2. Each of the channel regions CH may be disposed between a pair of the source/drain regions SD. The source/drain regions SD of the first active patterns AP1 may be P-type dopant regions. The source/drain regions SD of the second active patterns AP2 may be N-type dopant regions.

The source/drain regions SD may include epitaxial patterns formed using a selective epitaxial growth (SEG) process. Top surfaces of the source/drain regions SD may be disposed at a higher level than top surfaces of the channel regions CH. The source/drain regions SD may include a different semiconductor element from the substrate 100. In some embodiments, the source/drain regions SD of the first active patterns AP1 may include a semiconductor element of which a lattice constant is greater than that of the semiconductor element of the substrate 100. Thus, the source/drain regions SD of the first active patterns AP1 may provide compressive stress to the channel regions CH of the first active patterns AP1. In some embodiments, the source/drain regions SD of the second active patterns AP2 may include a semiconductor element of which a lattice constant is equal to or smaller than that of the semiconductor element of the substrate 100. In particular, in the event that the semiconductor element of the source/drain regions SD of the second active patterns AP2 has a smaller lattice constant than the semiconductor element of the substrate 100, the source/drain regions SD of the second active patterns AP2 may provide tensile stress to the channel regions CH of the second active patterns AP2.

First gate electrodes GE1 and second gate electrodes GE2 may extend in the first direction D1 to intersect the first and second active patterns AP1 and AP2. Each of the first and second gate electrodes GE1 and GE2 may cover the top surface and both sidewalls of the channel region CH. The first and second gate electrodes GE1 and GE2 may be spaced apart from each other in the second direction D2. At least one of the first gate electrodes GE1 and at least one of the second gate electrodes GE2 may extend in the first direction D1 to intersect the NMOSFET region NR, the second device isolation layer ST2, and the PMOSFET region PR. A pair of the first gate electrodes GE1 may be disposed on the third device isolation layer ST3.

Widths of the first gate electrodes GE1 may be different from widths of the second gate electrodes GE2. In some embodiments, a width W9 of each of the first gate electrodes GE1 may be greater than a width W10 of each of the second gate electrodes GE2.

The first gate electrodes GE1 may include first separated gate electrodes sg1, and the second gate electrodes GE2 may include second separated gate electrodes sg2. The first separated gate electrodes sg1 may intersect the PMOSFET region PR but may not extend onto the NMOSFET region NR. The second separated gate electrodes sg2 may intersect the NMOSFET region NR but may not extend onto the PMOSFET region PR. The first separated gate electrodes sg1 may be spaced apart from the second separated gate electrodes sg2 in the first direction D1. At least one of the first separated gate electrodes sg1 may be aligned with at least one of the second separated gate electrodes sg2 in the first direction D1.

Gate insulating patterns GI may be disposed between the gate electrodes GE1 and GE2 and the active patterns AP1 and AP2. Gate spacers GS may be provided on both sidewalls of each of the first and second gate electrodes GE1 and GE2. A gate capping pattern CP may be provided to cover a top surface of each of the first and second gate electrodes GE1 and GE2. First and second interlayer insulating layers 140 and 150 may be provided to cover the first and second active patterns AP1 and AP2 and the first and second gate electrodes GE1 and GE2.

The gate insulating pattern GI may vertically extend to cover the both sidewalls of each of the first and second gate electrodes GE1 and GE2. Thus, the gate insulating pattern GI may be disposed between each of the first and second gate electrodes GE1 and GE2 and the gate spacers GS.

The first and second gate electrodes GE1 and GE2 may include at least one of a doped semiconductor material, a conductive metal nitride (e.g., titanium nitride or tantalum nitride), or a metal (e.g., aluminum or tungsten). The gate insulating pattern GI may include at least one of a silicon oxide layer, a silicon oxynitride layer, or a high-k dielectric layer of which a dielectric constant is higher than that of a silicon oxide layer. For example, the high-k dielectric layer may include at least one of hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate. Each of the gate capping pattern CP and the gate spacer GS may include at least one of silicon oxide, silicon nitride, or silicon oxynitride. Each of the first and second interlayer insulating layers 140 and 150 may include a silicon oxide layer.

The first gate electrode GE1 and the second gate electrode GE2 will be described in more detail with reference to FIGS. 23A and 23B. Each of the first and second gate electrodes GE1 and GE2 may include first, second, and third metal patterns GP1, GP2, and GP3 which are sequentially stacked. The first to third metal patterns GP1, GP2, and GP3 may extend in the first direction D1. The first metal pattern GP1 may include a first capping pattern 131, a second capping pattern 132, and a third capping pattern 133, which are sequentially stacked.

The first capping pattern 131 may directly cover the gate insulating pattern GI. The second capping pattern 132 may be disposed between the first and third capping patterns 131 and 133. The first and second capping patterns 131 and 132 may adjust work functions of the first and second gate electrodes GE1 and GE2. In addition, the first and second capping patterns 131 and 132 may prevent a metal material from being diffused from the third capping pattern 133 and the second and third metal patterns GP2 and GP3 into the gate insulating pattern GI. Furthermore, the first and second capping patterns 131 and 132 may prevent a high-k dielectric material from being diffused from the gate insulating pattern G1 into the third capping pattern 133 and the second and third metal patterns GP2 and GP3. In other words, the first and second capping patterns 131 and 132 may act as a barrier layer. In some embodiments, materials of the first and second capping patterns 131 and 132 may be independent of each other, and each of the first and second capping patterns 131 and 132 may include at least one selected from a group consisting of a metal nitride, a metal carbide, a metal silicide, a metal-silicon nitride, and a metal-silicon carbide, which include at least one of titanium (Ti) or tantalum (Ta).

The third capping pattern 133 may include a metal material having a high work function. The metal material having the high work function may include an N-type work function metal or a P-type work function metal. The N-type work function metal may be a metal material mainly used in a gate electrode of an NMOS field effect transistor, and the P-type work function metal may be a metal material mainly used in a gate electrode of a PMOS field effect transistor. At this time, a work function of the P-type work function metal may be greater than that of the N-type work function metal. In some embodiments, the third capping pattern 133 may include the P-type work function metal. The P-type work function metal may include at least one of, e.g., Ti, Ta, W, Pd, Ru, Ir, Pt, Nb, Mo, Hf, or any nitride or carbide thereof. In more detail, the P-type work function metal may include at least one of, e.g., Mo, Pd, Ru, Pt, TiN, WN, TaN, Ir, TaC, RuN, or MoN. In some embodiments, the third capping pattern 133 may have a multi-layered structure including at least two P-type work function metals different from each other.

The third capping pattern 133 may prevent atoms or ions from being diffused between the second metal pattern GP2 and the first and second capping patterns 131 and 132. The third capping pattern 133 may inhibit an excessive increase in work function of the second metal pattern GP2, which is caused by the first and second capping patterns 131 and 132.

The second metal pattern GP2 may directly cover a top surface of the first metal pattern GP1. The second metal pattern GP2 may include a metal material having a high work function, e.g., an N-type work function metal. The N-type work function metal of the second metal pattern GP2 may include an aluminum (Al) compound containing titanium (Ti) or tantalum (Ta). For example, the N-type work function metal of the second metal pattern GP2 may include TiAlC, TiAlN, TiAlC—N, TiAl, TaAlC, TaAlN, TaAlC—N, or TaAl. In some embodiments, the second metal pattern GP2 may have a multi-layered structure including at least two N-type work function metals different from each other.

The third metal pattern GP3 may directly cover a top surface of the second metal pattern GP2. In some embodiments, the third metal pattern GP3 may include a low-resistance metal including at least one of aluminum (Al), tungsten (W), titanium (Ti), or tantalum (Ta). Resistances of the first and second metal patterns GP1 and GP2 may be higher than that of the third metal pattern GP3. Increase in resistance of the first and second gate electrodes GE1 and GE2 may cause deterioration of AC performance of the field effect transistors. However, according to some embodiments, the resistances of the first and second gate electrodes GE1 and GE2 may be reduced by the third metal patterns GP3 having the relatively low resistances, and thus the AC performance of the field effect transistors may be improved.

As described above, the width W9 of the first gate electrode GE1 may be greater than the width W10 of the second gate electrode GE2. A volume fraction of the second metal pattern GP2 in the first gate electrode GE1 may be smaller than a volume fraction of the second metal pattern GP2 in the second gate electrode GE2. A bottom surface of the third metal pattern GP3 of the first gate electrode GE1 may be lower than the topmost surface of the first metal pattern GP1. On the other hand, a bottom surface of the third metal pattern GP3 of the second gate electrode GE2 may be higher than the topmost surface of the first metal pattern GP1. In other words, the bottom surface of the third metal pattern GP3 of the first gate electrode GE1 may be lower than the bottom surface of the third metal pattern GP3 of the second gate electrode GE2.

Referring to FIGS. 20, 21, and 22A to 22E, the first active patterns AP1 may include first recess regions RS1 formed in the upper portions thereof. The second active patterns AP2 may include second recess regions RS2a and RS2b formed in the upper portions thereof. The second recess regions RS2a and RS2b may include narrow recess regions RS2a and wide recess regions RS2b.

Some of the first recess regions RS1 may be disposed on the boundary between the first and second cell regions SC1 and SC2. Others of the first recess regions RS1 may be disposed in the first cell region SC1. The narrow recess regions RS2a of the second recess regions may be disposed on the boundary between the first and second cell regions SC1 and SC2. The wide recess regions RS2b of the second recess regions may be disposed in the first cell region SC1.

The first recess regions RS1 may correspond to the first isolation region ISY1 described with reference to FIG. 20. The narrow recess regions RS2a of the second recess regions may correspond to the second isolation region ISY2 described with reference to FIG. 20. The wide recess regions RS2b of the second recess regions may correspond to the first isolation region ISY1 formed in the NMOSFET region NR of the first cell region SC1, which is described with reference to FIG. 20. A width W1 of each of the first recess regions RS1 may be greater than a width W2 of each of the narrow recess regions RS2a of the second recess regions.

The width W1 of each of the first recess regions RS1 may be substantially equal to a width W1 of each of the wide recess regions RS2b of the second recess regions.

First isolation regions DB1 may be provided on the first isolation regions ISY1 described with reference to FIG. 20, and a second isolation region DB2 may be provided on the second isolation region ISY2 described with reference to FIG. 20. The first and second isolation patterns DB1 and DB2 may extend in the first direction D1 in parallel to the first and second gate electrodes GE1 and GE2. Diffusion barrier portions of the first isolation patterns DB1 may fill the first recess regions RS1 and the wide recess regions RS2b of the second recess regions. Diffusion barrier portions of the second isolation pattern DB2 may fill the narrow recess regions RS2a of the second recess regions.

The first isolation pattern DB1 on the boundary between the first and second cell regions SC1 and SC2 may be disposed between a pair of the first separated gate electrodes sg1. The second isolation pattern DB2 on the boundary between the first and second cell regions SC1 and SC2 may be disposed between a pair of the second separated gate electrodes sg2. The first and second isolation patterns DB1 and DB2, which are disposed on the boundary between the first and second cell regions SC1 and SC2, may be aligned with each other in the first direction D1. The first isolation pattern DB1 disposed in the first cell region SC1 may extend in the first direction D1 to intersect the NMOSFET region NR, the second device isolation layer ST2, and the PMOSFET region PR.

The first and second isolation patterns DB1 and DB2 disposed on the boundary between the first and second cell regions SC1 and SC2 may prevent carriers from moving between the first and second cell regions SC1 and SC2. Other features and structures of the first and second isolation patterns DB1 and DB2 may be the same or similar as described with reference to FIGS. 1, 2A, 2B, 3, 16, and 17.

Active contacts AC may be provided in the first and second interlayer insulating layers 140 and 150. Top surfaces of the active contacts AC may be substantially coplanar with a top surface of the second interlayer insulating layer 150. The active contacts AC may be disposed on the PMOSFET region PR and the NMOSFET region NR. The active contacts AC may be disposed between the gate electrodes GE1 and GE2. Each of the active contacts AC may have a line or bar shape extending in the first direction D1. Each of the active contacts AC may be connected directly to the source/drain regions SD. For example, the active contacts AC may include at least one of a conductive metal nitride (e.g., titanium nitride or tantalum nitride) or a metal (e.g., aluminum or tungsten).

Even though not shown in the drawings, barrier patterns may be disposed between the active contacts AC and the interlayer insulating layers 140 and 150. Each of the barrier patterns may directly cover sidewalls and a bottom surface of each of the active contacts AC except a top surface of each of the active contacts AC. The barrier patterns may include a metal nitride (e.g., titanium nitride (TiN)).

According to some embodiments, the first isolation pattern DB1 having the relatively wide width may be provided on the cell boundary on the PMOSFET region PR, and the second isolation pattern DB2 having the relatively narrow width may be provided on the cell boundary on the NMOSFET region NR. Since electrical characteristics of the PMOS transistors of the PMOSFET region PR are different from electrical characteristics of the NMOS transistors of the NMOSFET region NR, a difference in performance between the PMOS and NMOS transistors may be reduced using the isolation patterns having different widths.

Figure 27A:
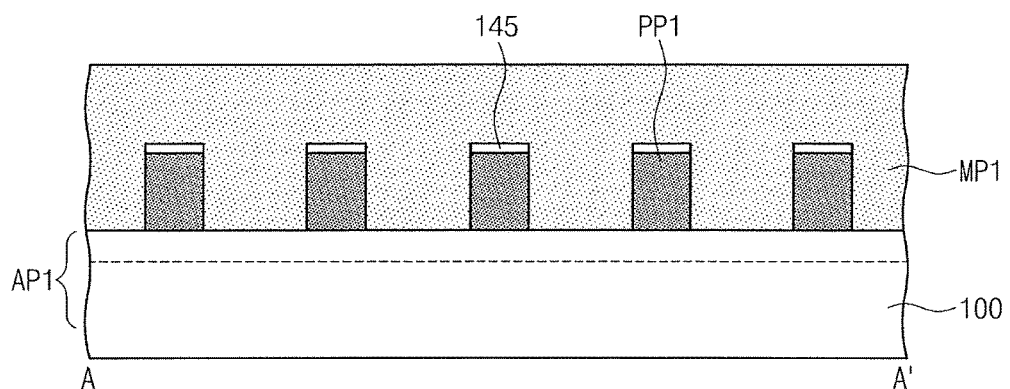
Figure 27A:
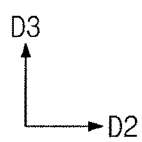
Figure 27B:
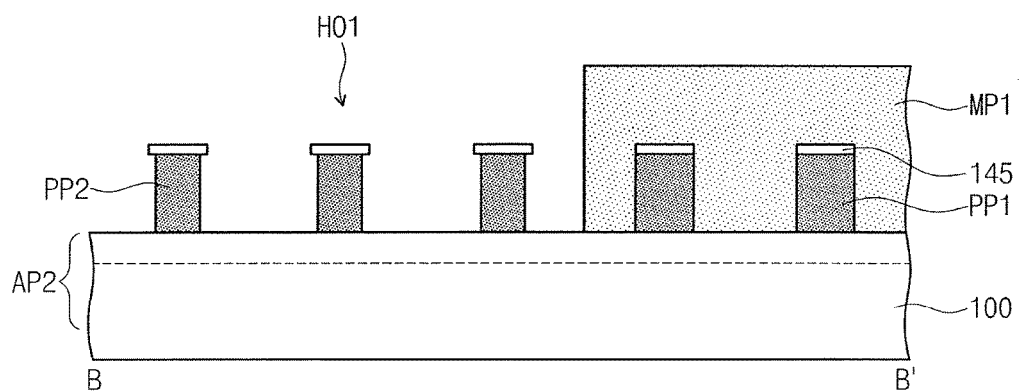
Figure 27B:
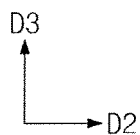
Figure 27C:
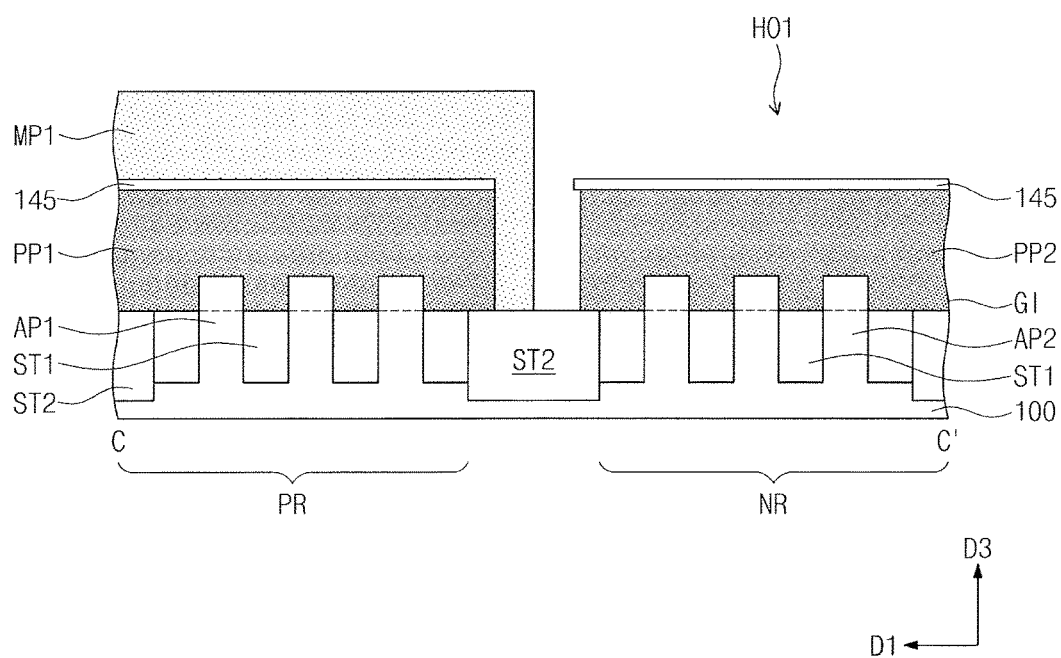
FIGS. 27C, 29C, and 31C illustrate cross-sectional views along line C-C' of FIGS. 26, 28, and 30, respectively.
Figure 28:
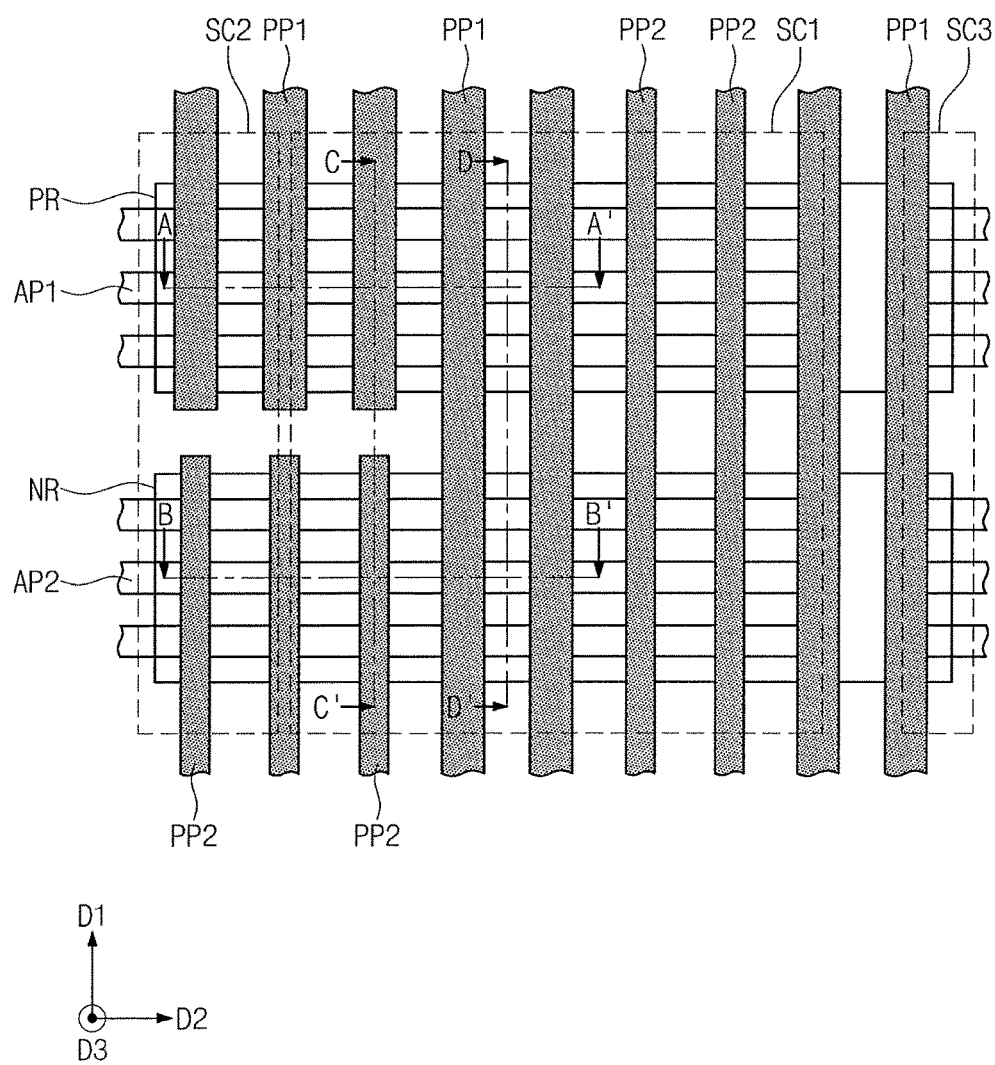
Figure 29A:
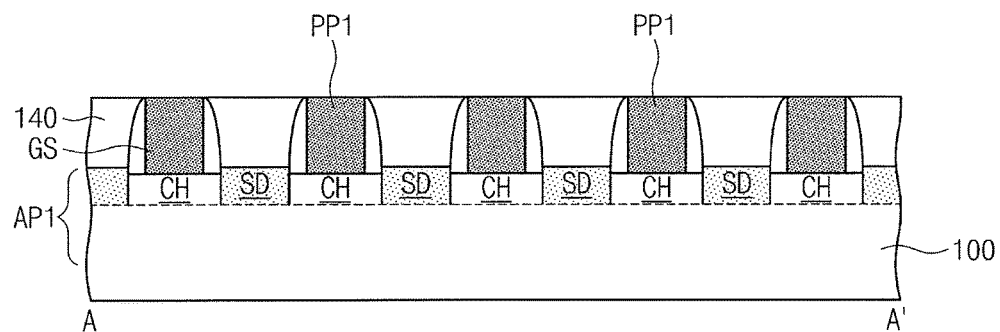
Figure 29A:
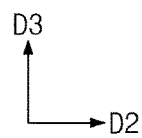
Figure 29B:
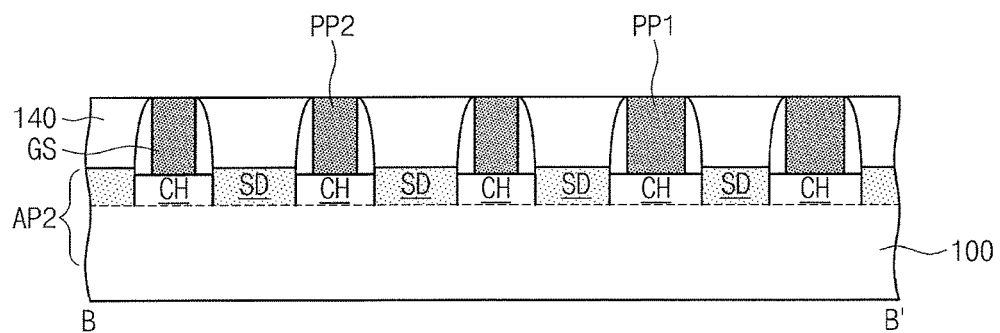
Figure 29B:
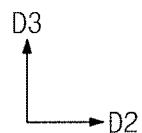
Figure 29C:
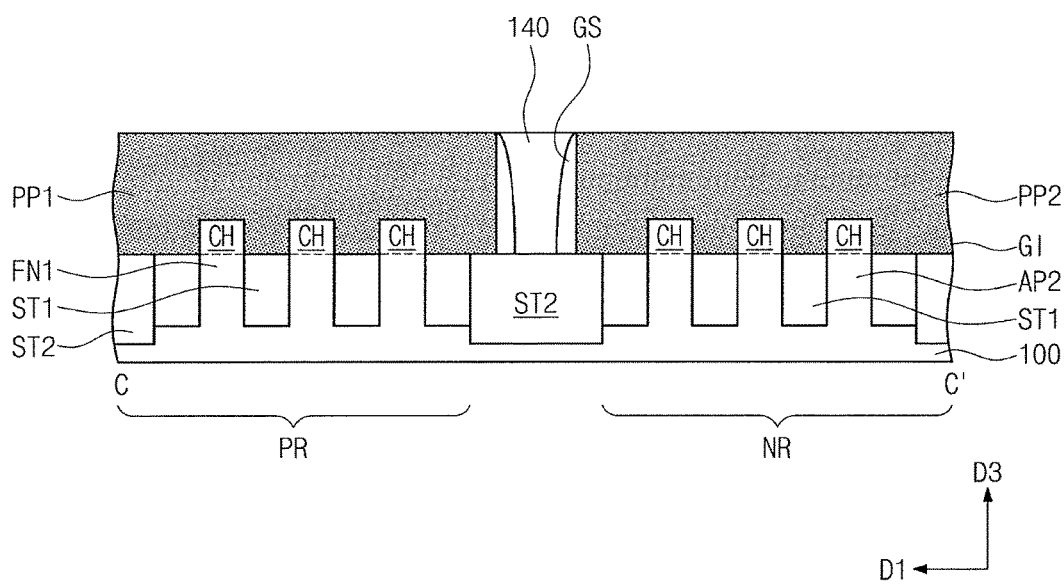
Figure 29D:
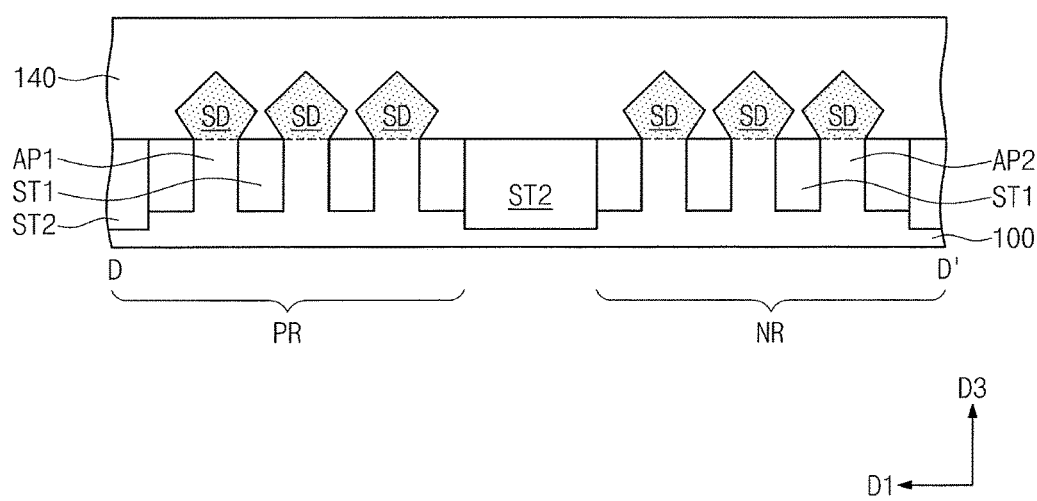
FIGS. 29D and 31D illustrate cross-sectional views along line D-D' of FIGS. 28 and 30, respectively.
Figure 30:
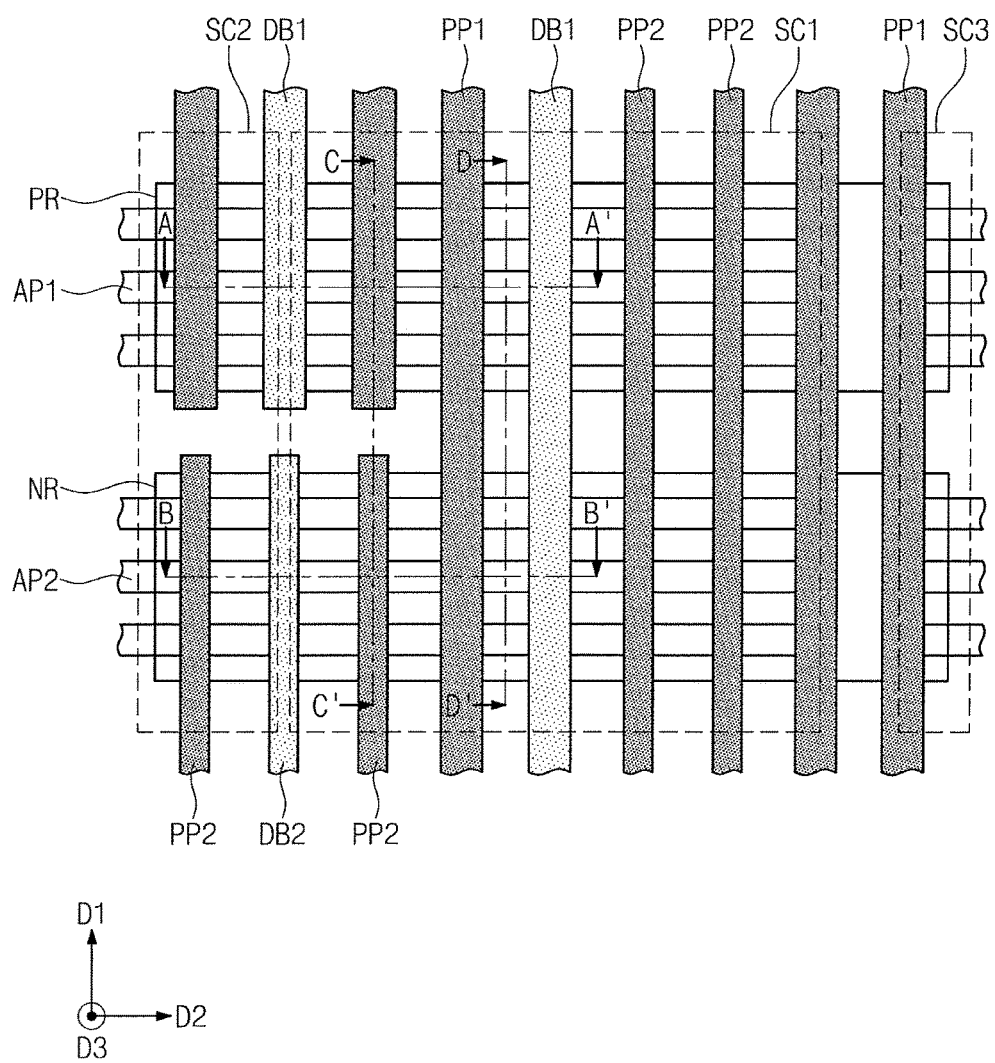
Figure 31A:
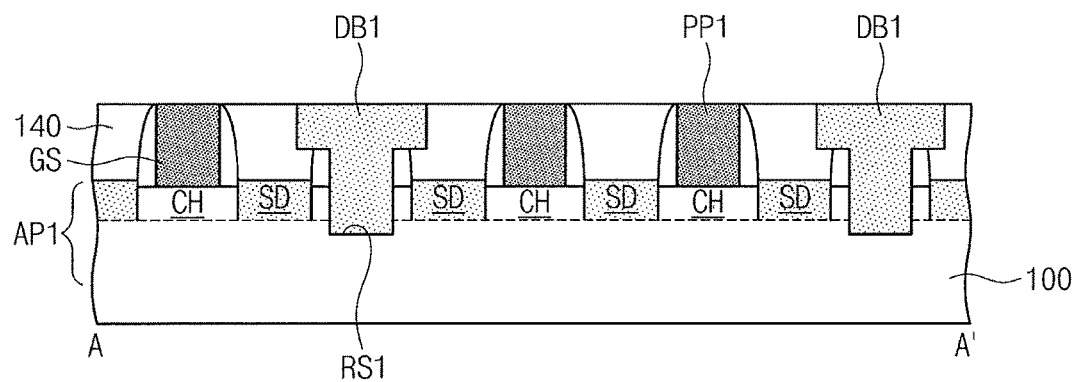
Figure 31A:
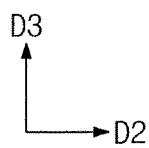
Figure 31B:
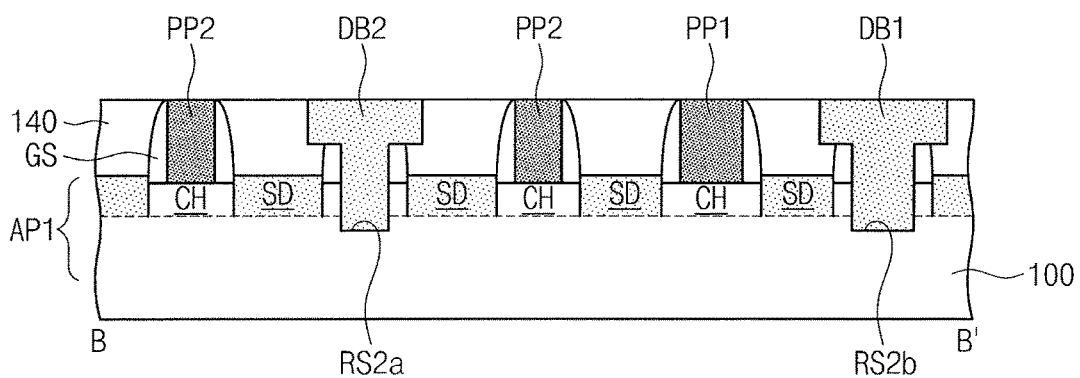
Figure 31B:
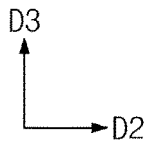
Figure 31C:
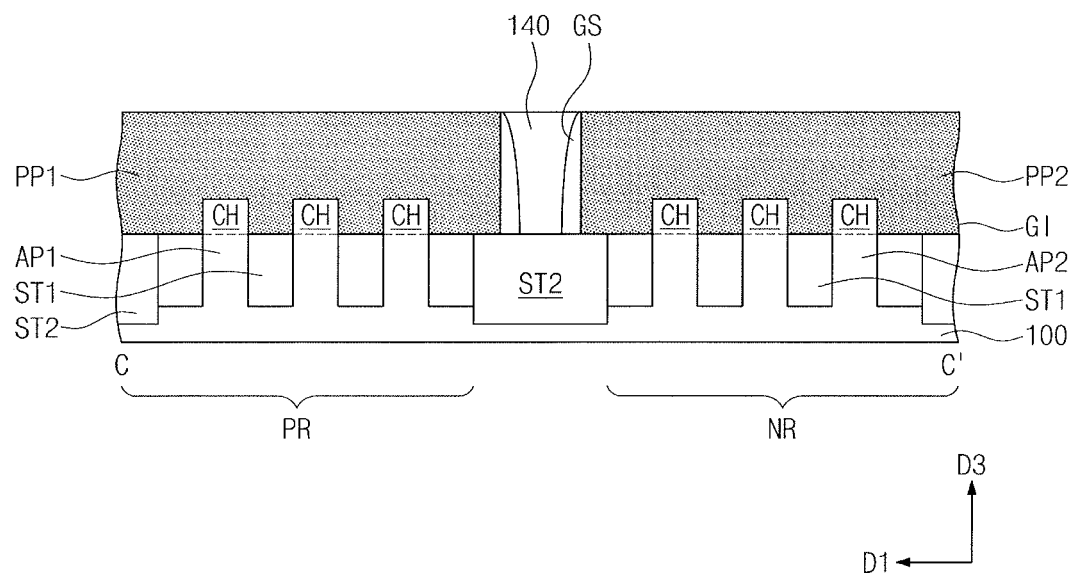
Figure 31D:
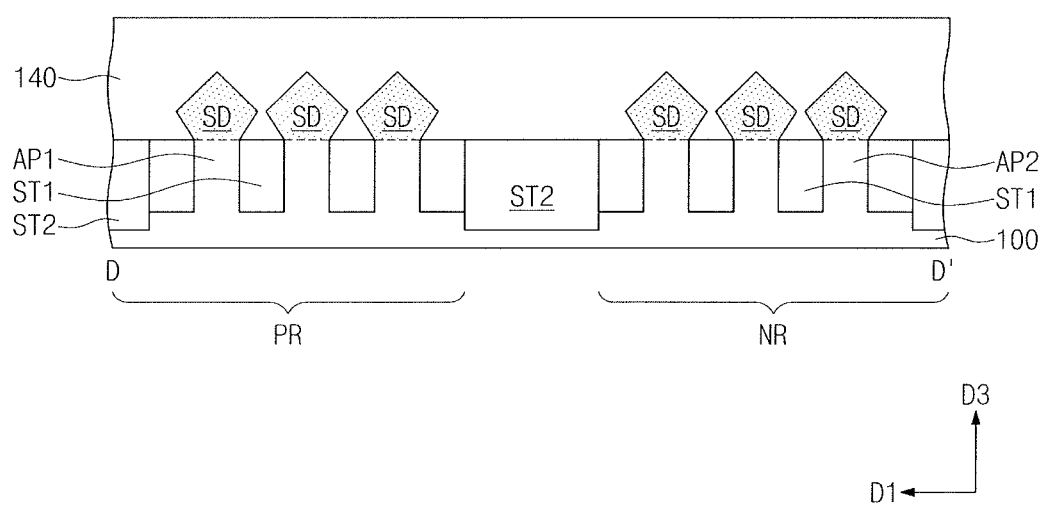

FIGS. 24, 26, 28, and 30 are plan views illustrating a method for manufacturing a semiconductor device according to some embodiments. FIGS. 25A, 27A, 29A, and 31A are cross-sectional views taken along lines A-A' of FIGS. 24, 26, 28, and 30, respectively. FIGS. 25B, 27B, 29B, and 31B are cross-sectional views taken along lines B-B' of FIGS. 24, 26, 28, and 30, respectively. FIGS. 27C, 29C, and 31C are cross-sectional views taken along lines C-C' of FIGS. 26, 28, and 30, respectively. FIGS. 29D and 31D are cross-sectional views taken along lines D-D' of FIGS. 28 and 30, respectively. In the present embodiment, the descriptions to the same technical features as in the above embodiments will be omitted or mentioned briefly for the purpose of ease and convenience in explanation. In other words, differences between the present embodiment and the above embodiments will be mainly described hereinafter.

Figure 24:
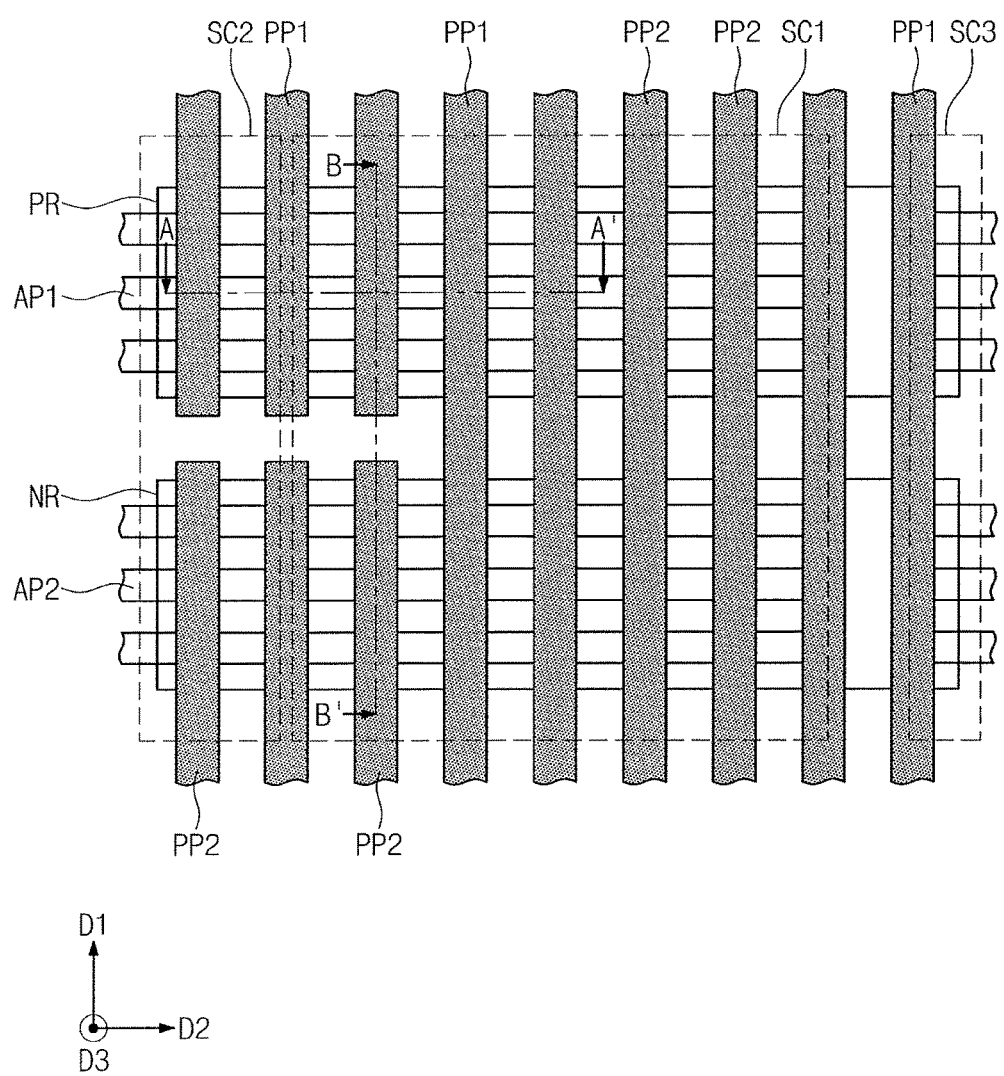
FIGS. 24, 26, 28, and 30 illustrate plan views of stages in a method for manufacturing a semiconductor device according to some embodiments.
Figure 25A:
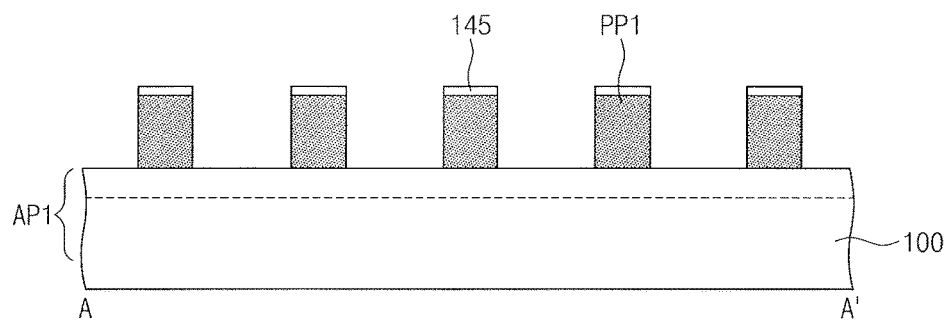
FIGS. 25A, 27A, 29A, and 31A illustrate cross-sectional views along line A-A' of FIGS. 24, 26, 28, and 30, respectively.
Figure 25B:
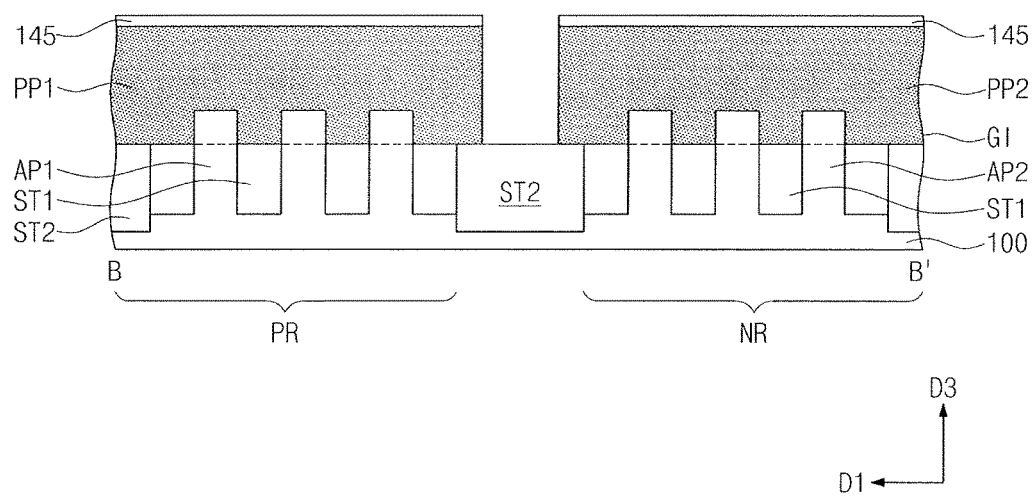
FIGS. 25B, 27B, 29B, and 31B illustrate cross-sectional views along line B-B' of FIGS. 24, 26, 28, and 30, respectively.
Figure 26:
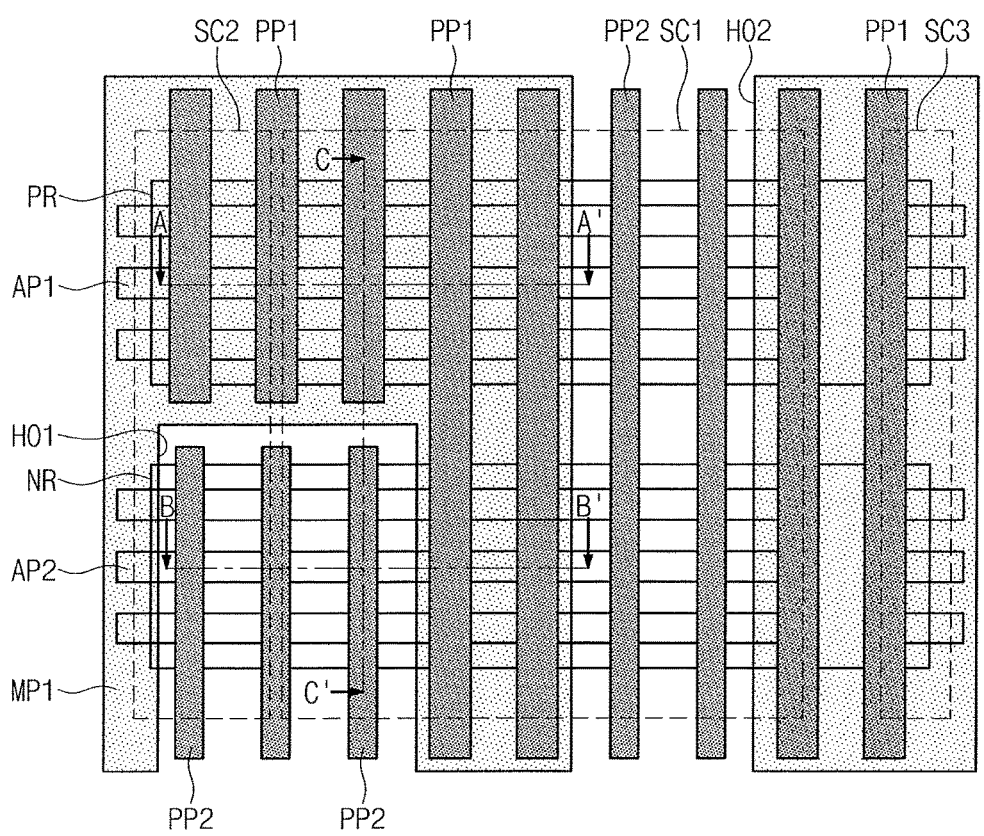
Figure 26:
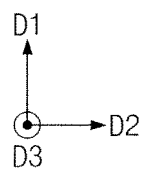

Referring to FIGS. 24, 25A, and 25B, a substrate 100 may be patterned to form first and second active patterns AP1 and AP2. The first active patterns AP1 may be formed on a PMOSFET region PR of the substrate 100, and the second active patterns AP2 may be formed on an NMOSFET region NR of the substrate 100.

First, second, and third device isolation layers ST1, ST2, and ST3 may be formed in trenches between the first and second active patterns AP1 and AP2. In some embodiments, an insulating layer may be formed to fill the trenches, and the insulating layer may be recessed until upper portions of the first and second active patterns AP1 and AP2 are exposed, thereby forming the first to third device isolation layers ST1, ST2, and ST3.

First and second sacrificial patterns PP1 and PP2 may be formed to intersect the first and second active patterns AP1 and AP2. The first and second sacrificial patterns PP1 and PP2 may be formed by a patterning process using hard mask patterns 145 as etch masks. Each of the first and second sacrificial patterns PP1 and PP2 may have a line or bar shape extending in a first direction D1. Widths of the first and second sacrificial patterns PP1 and PP2 may be substantially equal to each other.

Referring to FIGS. 26, 27A, 27B, and 27C, a first mask pattern MP1 may be formed to cover the first sacrificial patterns PP1. The first mask pattern MP1 may include a first hole HO1 and a second hole HO2 which expose the second sacrificial patterns PP2. The second sacrificial patterns PP2 may be partially etched using the first mask pattern MP1 as an etch mask. Sizes of the second sacrificial patterns PP2 may be reduced by the etching process. Thus, widths of the second sacrificial patterns PP2 etched by the etching process may be smaller than the widths of the first sacrificial patterns PP1. Thereafter, the first mask pattern MP1 may be removed.

Referring to FIGS. 28, 29A, 29B, 29C, and 29D, a pair of gate spacers GS may be formed on both sidewalls of each of the first and second sacrificial patterns PP1 and PP2, respectively. Source/drain regions SD may be formed at both sides of each of the first and second sacrificial patterns PP1 and PP2. The formation of the source/drain regions SD may include etching the upper portions of the first and second active patterns AP1 and AP2 by using the gate spacers GS and the hard mask patterns 145 as etch masks, and performing a selective epitaxial growth (SEG) process using the etched portions of the first and second active patterns AP1 and AP2 as a seed layer. Since the source/drain regions SD are formed, a channel region CH may be defined between a pair of the source/drain regions SD. For example, the SEG process may include a chemical vapor deposition (CVD) process or a molecular beam epitaxy (MBE) process.

A first interlayer insulating layer 140 may be formed to cover the source/drain regions SD, the hard mask patterns 145, and the gate spacers GS. The first interlayer insulating layer 140 may be planarized until top surfaces of the first and second sacrificial patterns PP1 and PP2 are exposed. As a result, a top surface of the first interlayer insulating layer 140 may be substantially coplanar with the top surfaces of the first and second sacrificial patterns PP1 and PP2.

Referring to FIGS. 30, 31A, 31B, 31C, and 31D, some of the first sacrificial patterns PP1 may be replaced with first isolation patterns DB1. At least one of the second sacrificial patterns PP2 may be replaced with a second isolation pattern DB2. The formation of the first and second isolation patterns DB1 and DB2 may be the same or similar as described with reference to FIGS. 1, 2A, 2B, 3, 4, 6, 8, 10, 12, 14, 5A, 5B, 7A, 7B, 9A, 9B, 11A, 11B, 13A, 13B, 15A, and 15B.

Referring again to FIGS. 21 and 22A to 22E, remaining ones of the first sacrificial patterns PPI may be replaced with first gate electrodes GE1, and remaining ones of the second sacrificial patterns PP2 may be replaced with second gate electrodes GE2. In more detail, the remaining ones of the first and second sacrificial patterns PP1 and PP2 may be selectively removed. Gate insulating patterns GI, the first and second gate electrodes GE1 and GE2, and gate capping patterns CP may be formed in empty spaces formed by the removal of the first and second sacrificial patterns PP1 and PP2.

The gate insulating pattern GI may be conformally formed in the empty space and may not completely fill the empty space. The gate insulating pattern GI may be formed using an atomic layer deposition (ALD) process or a chemical oxidation process. Gate metal layers may be formed to completely fill the empty spaces, and a planarization process may be performed on the gate metal layers to form the first and second gate electrodes GE1 and GE2. Subsequently, upper portions of the first and second gate electrodes GE1 and GE2 may be recessed. Next, the gate capping patterns CP may be formed on the first and second gate electrodes GE1 and GE2, respectively. The gate capping patterns CP may be formed to completely fill the recessed region of the first and second gate electrodes GE1 and GE in the empty spaces.

The second interlayer insulating layer 150 may be formed on the first interlayer insulating layer 140 and the gate capping patterns CP. Contact holes may be formed to penetrate the second interlayer insulating layer 150 and the first interlayer insulating layer 140. The contact holes may expose the source/drain regions SD. In some embodiments, the contact holes may be self-aligned by the gate capping patterns CP and the gate spacers GS. Active contacts AC may be formed in the contact holes. The active contacts AC may be in contact with the source/drain regions SD.

Figure 32A:
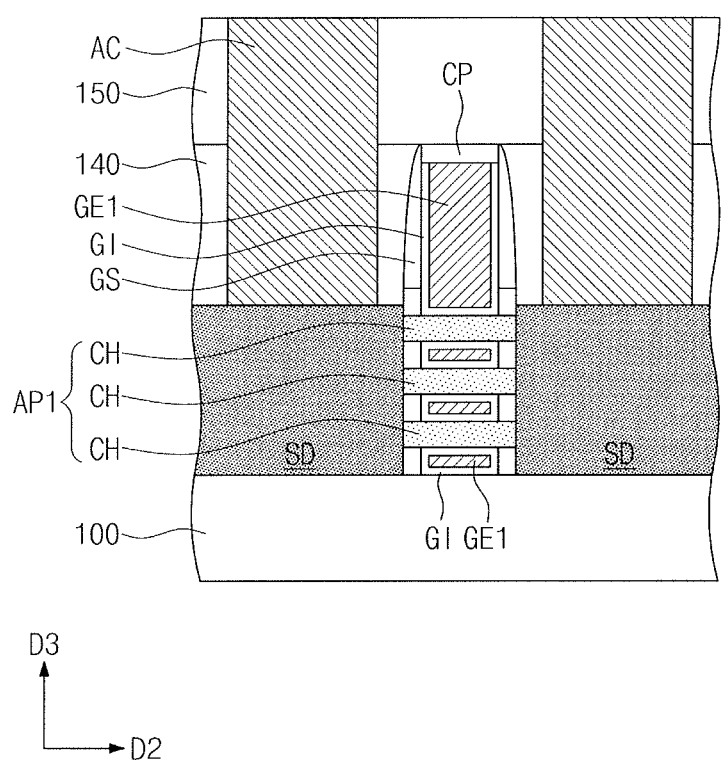
FIGS. 32A and 32B illustrate cross-sectional views of a semiconductor device according to some embodiments.
Figure 32B:
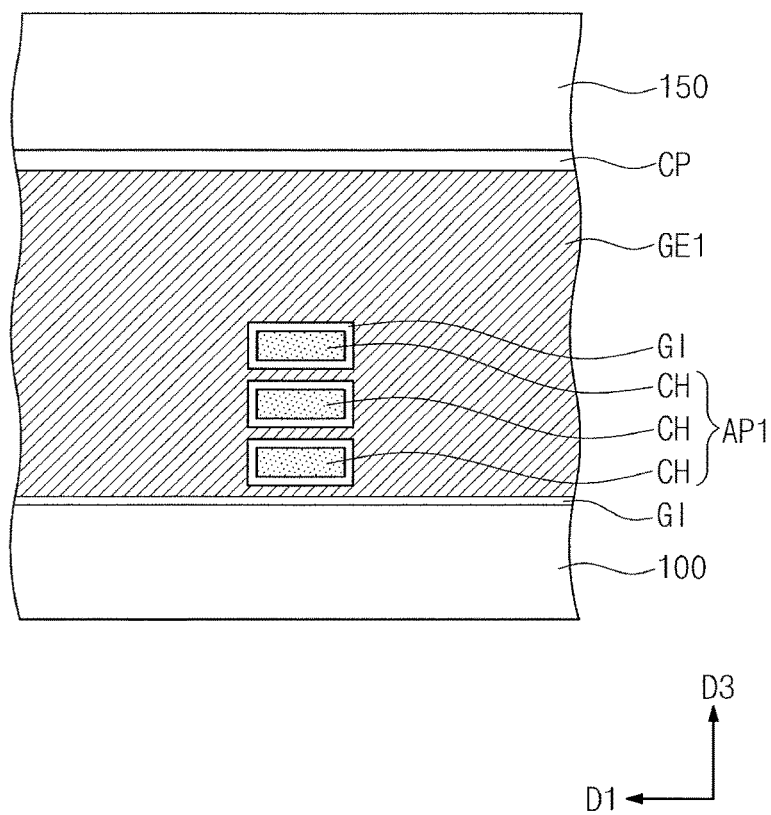

FIGS. 32A and 32B are cross-sectional views illustrating a semiconductor device according to some embodiments. FIG. 32A corresponds to a cross-sectional view, taken along in the second direction, of the first gate electrode and the first active pattern of FIG. 21. FIG. 32B corresponds to a cross-sectional view, taken along in the first direction, of the first gate electrode and the first active pattern of FIG. 21. In the present embodiment, the descriptions to the same technical features as in the embodiments of FIGS. 21 and 22A to 22E will be omitted or mentioned briefly for the purpose of ease and convenience in explanation. In other words, differences between the present embodiment and the embodiments of FIGS. 21 and 22A to 22E will be mainly described hereinafter.

Referring to FIGS. 21, 32A, and 32B, each of first and second active patterns AP1 and AP2 may include a plurality of channel regions CH sequentially stacked. The stacked channel regions CH may be spaced apart from each other in a vertical direction D3. The stacked channel regions CH may be stacked semiconductor patterns. The channel regions CH may include the same semiconductor element as or a different semiconductor element from the substrate 100. For example, the channel regions CH may include silicon, germanium, or silicon-germanium.

Each of the first and second active patterns AP1 and AP2 may further include a pair of source/drain regions SD. The stacked channel regions CH may be disposed between the pair of source/drain regions SD.

A first gate electrode GE1 and a gate insulating pattern GI may fill spaces between the stacked channel regions CH of the first active pattern AP1. Likewise, a second gate electrode GE2 and a gate insulating pattern GI may fill spaces between the stacked channel regions CH of the second active pattern AP2. The gate insulating pattern GI may be in direct contact with the channel regions CH, and the first gate electrode GE1 may be spaced apart from the channel regions CH with the gate insulating pattern GI interposed therebetween.

A semiconductor device according to the present embodiment may include a gate-all-around-type field effect transistor in which the gate electrode GE1 completely surrounds an outer circumferential surface of each of the channel regions CH. Other components and/or other structural features of the semiconductor device according to the present embodiment may be the same or similar as corresponding components and/or corresponding structural features of the semiconductor device described with reference to FIGS. 21 and 22A to 22E.

Embodiments provide a semiconductor device including a field effect transistor with improved electrical characteristics. Embodiments also provide a method for manufacturing a semiconductor device including a field effect transistor with improved electrical characteristics.

That is, according to embodiments, isolation patterns disposed on different regions may have widths different from each other, and thus it is possible to reduce the performance difference between semiconductor components respectively disposed on the different regions. In addition, the isolation patterns of which the insulating patterns have volume fractions different from each other may be provided on the different regions, and thus it is possible to further reduce the performance difference between the semiconductor components on the different regions.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate having a first active pattern and a second active pattern, a longitudinal direction of each of the first active pattern and the second active pattern extending in a first direction, the first active pattern including a first recess region dividing an upper portion of the first active pattern into a first portion and a second portion adjacent to each other along the first direction, and the second active pattern including a second recess region dividing an upper portion of the second active pattern into a first portion and a second portion adjacent to each other along the first direction;
a first insulating pattern covering an inner sidewall of the first recess region of the first active pattern; and
a second insulating pattern covering an inner sidewall of the second recess region of the second active pattern,
wherein the first insulating pattern of the first recess region of the first active pattern and the second insulating pattern of the second recess region of the second active pattern include a same insulating material, and
wherein a volume fraction of the first insulating pattern of the first recess region of the first active pattern with respect to a volume of the first recess region of the first active pattern is smaller than a volume fraction of the second insulating pattern of the second recess region of the second active pattern with respect to a volume of the second recess region of the second active pattern.

2. The semiconductor device as claimed in claim 1, wherein:
the first portion and the second portion of the first active pattern are collinear along the first direction, and the first portion and the second portion of the second active pattern are collinear along the first direction, and
a width of the first recess region of the first active pattern in the first direction is greater than a width of the second recess region of the second active pattern in the first direction.

3. The semiconductor device as claimed in claim 2, wherein the width of the first recess region of the first active pattern progressively decreases from an upper portion toward a lower portion of the first recess region of the first active pattern, and the width of the second recess region of the second active pattern progressively decreases from an upper portion toward a lower portion of the second recess region of the second active pattern.

4. The semiconductor device as claimed in claim 1, further comprising a device isolation layer on the substrate to define the first and second active patterns, respectively, a top surface of the device isolation layer being higher than respective bottoms of the first recess region of the first active pattern and second recess regions of the second active pattern.

5. The semiconductor device as claimed in claim 1, further comprising first and second gate spacers intersecting the first and second active patterns, respectively;
wherein the first insulating pattern of the first recess region of the first active pattern extends onto a sidewall of the first gate spacer, and
wherein the second insulating pattern of the second recess region of the second active pattern extends onto a sidewall of the second gate spacer.

6. The semiconductor device as claimed in claim 5, further comprising:
a first insulating spacer between the first insulating pattern of the first recess region of the first active pattern and the first gate spacer; and a second insulating spacer between the second insulating pattern of the second recess region of the second active pattern and the second gate spacer, wherein a sidewall of the first insulating spacer is aligned with the inner sidewall of the first recess region, and wherein a sidewall of the second insulating spacer is aligned with the inner sidewall of the second recess region.

7. The semiconductor device as claimed in claim 1, further comprising:
an interlayer insulating layer covering the first and second active patterns on the substrate; and
first and second upper insulating patterns on the first insulating pattern of the first recess region of the first active pattern and the second insulating pattern of the second recess region of the second active pattern, respectively;
wherein the first and second upper insulating patterns on the first insulating pattern of the first recess region of the first active pattern and the second insulating patterns of the second recess region of the second active pattern, respectively, include a same insulating material as the interlayer insulating layer.

8. The semiconductor device as claimed in claim 1, wherein a thickness of the first insulating pattern of the first recess region of the first active pattern on the inner sidewall of the first recess region of the first active pattern is substantially equal to a thickness of the second insulating pattern of the second recess region of the second active pattern on the inner sidewall of the second recess region of the second active pattern.

9. The semiconductor device as claimed in claim 1, wherein the volume fraction of the second insulating pattern of the second recess region of the second active pattern with respect to the volume of the second recess region of the second active pattern is about 100%.

10. The semiconductor device as claimed in claim 1, wherein:
the first insulating pattern of the first recess region of the first active pattern prevents carriers from moving between the first portion and the second portion of the first active pattern, and
the second insulating pattern of the second recess region of the second active pattern prevents carriers from moving between the first portion and the second portion of the second active pattern.

11. The semiconductor device of claim 1, wherein a depth of the first recess region is greater than a depth of the second recess region.

12. A semiconductor device, comprising:
a substrate including a first active pattern and a second active pattern, a longitudinal direction of each of the first active pattern and the second active pattern extending in a first direction;
first gate electrodes along a second direction intersecting the first active pattern;
second gate electrodes along the second direction intersecting the second active pattern;
a first isolation pattern between the first gate electrodes to divide an upper portion of the first active pattern into a first portion and a second portion adjacent to each other along the first direction; and
a second isolation pattern between the second gate electrodes to divide an upper portion of the second active pattern into a first portion and a second portion adjacent to each other along the first direction, wherein a width of at least one of the first gate electrodes along the first direction is greater than a width of at least one of the second gate electrodes along the first direction, and wherein a width of the first isolation pattern between the first and second portions of the first active pattern is greater than a width of the second isolation pattern between the first and second portions of the second active pattern.

13. The semiconductor device as claimed in claim 12, wherein:
each of the first and second isolation patterns includes a first insulating pattern, and a second insulating pattern on the first insulating pattern, and
a volume fraction of the first insulating pattern with respect to a volume of the first isolation pattern between the first and second portions of the first active pattern is smaller than a volume fraction of the first insulating pattern with respect to a volume of the second isolation pattern between the first and second portions of the second active pattern.

14. The semiconductor device as claimed in claim 12, further comprising a device isolation layer on the substrate to define the first and second active patterns, respectively;
wherein a top surface of the device isolation layer is higher than a bottom surface of the first isolation pattern between the first and second portions of the first active pattern, and
wherein the top surface of the device isolation layer is higher than a bottom surface of the second isolation pattern between the first and second portions of the second active pattern.

15. The semiconductor device as claimed in claim 12, further comprising gate spacers on respective sidewalls of the first and second gate electrodes and respective sidewalls of the first and second isolation patterns,
wherein respective upper portions of the first and second isolation patterns cover respective top surfaces of each of the gate spacers on respective sidewalls of the first and second isolation patterns.

16. The semiconductor device as claimed in claim 12, wherein:
the first gate electrodes extend in a second direction and are spaced apart from each other in the first direction intersecting the second direction,
the second gate electrodes extend in the second direction and are spaced apart from each other in the first direction,
the first isolation pattern is between a pair of adjacent first gate electrodes,
the second isolation pattern is between a pair of adjacent second gate electrodes, and
the first and second isolation patterns are spaced apart from each other and are aligned with each other in the second direction.

17. A semiconductor device, comprising:
a substrate having a first active pattern and a second active pattern, a longitudinal direction of each of the first active pattern and the second active pattern extending in a first direction, the first active pattern including a first recess region dividing an upper portion of the first active pattern into a first portion and a second portion adjacent to each other along the first direction, and the second active pattern including a second recess region dividing an upper portion of the second active pattern into a first portion and a second portion adjacent to each other along the first direction;

a first insulating pattern covering an inner sidewall of the first recess region of the first active pattern; and a second insulating pattern covering an inner sidewall of the second recess region of the second active pattern, the first recess region of the first active pattern being wider than the second recess region of the second active pattern along the first direction, wherein the first insulating pattern of the first recess region of the first active pattern and the second insulating pattern of the second recess region of the second active pattern include a same insulating material and have a same thickness in the first recess region of the first active pattern and the second recess region of the second active pattern, respectively.

18. The semiconductor device as claimed in claim 17, wherein a width direction of each of the first recess region of the first active pattern and the second recess region of the second active pattern, respectively, is along a same direction as a space between the first and second portions of each respective first and second active patterns.

19. The semiconductor device as claimed in claim 17, wherein a volume fraction of the first insulating pattern of the first recess region of the first active pattern with respect to a volume of the first recess region of the first active pattern is smaller than a volume fraction of the second insulating pattern of the second recess region of the second active pattern with respect to a volume of the second recess region of the second active pattern.

20. The semiconductor device as claimed in claim 17, wherein the first and second insulating patterns are conformal in the first recess region of the first active pattern and the second recess region of the second active pattern, respectively, the first and second insulating patterns extending above the first and second active patterns.

* * * * *